US012648174B2

(12) United States Patent
Akiba et al.

(10) Patent No.: US 12,648,174 B2
(45) Date of Patent: Jun. 2, 2026

(54) SEMICONDUCTOR DEVICE

(71) Applicant: DENSO CORPORATION, Kariya-city (JP)

(72) Inventors: Atsuya Akiba, Kariya-city (JP); Yuichi Takeuchi, Kariya-city (JP); Kazuki Arakawa, Kariya-city (JP); Yusuke Hayama, Kariya-city (JP); Yasushi Urakami, Kariya-city (JP); Shinichiro Miyahara, Kariya-city (JP); Tomoo Morino, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 396 days.

(21) Appl. No.: 18/506,290

(22) Filed: Nov. 10, 2023

(65) Prior Publication Data

US 2024/0079492 A1     Mar. 7, 2024

Related U.S. Application Data

(63) Continuation of application No. PCT/JP2022/013846, filed on Mar. 24, 2022.

(30) Foreign Application Priority Data

May 14, 2021     (JP) ................................. 2021-082800

(51) Int. Cl.
| *H10D 30/66* | (2025.01) |
| *H10D 62/10* | (2025.01) |

(Continued)

(52) U.S. Cl.
CPC ......... *H10D 30/668* (2025.01); *H10D 62/127* (2025.01); *H10D 62/393* (2025.01); *H10D 62/8325* (2025.01)

(58) Field of Classification Search
CPC .. H10D 30/668; H10D 62/127; H10D 62/393; H10D 62/8325
See application file for complete search history.

(56) References Cited

U.S. PATENT DOCUMENTS

| 2009/0200559 | A1* | 8/2009 | Suzuki ............... | H10D 30/0297 257/77 |
| 2012/0012860 | A1* | 1/2012 | Miyahara ............. | H10D 30/668 257/E27.06 |

(Continued)

FOREIGN PATENT DOCUMENTS

JP     WO2019044921 A1 *  3/2019

*Primary Examiner* — Benjamin Tzu-Hung Liu
(74) *Attorney, Agent, or Firm* — Posz Law Group, PLC

(57)     ABSTRACT

A semiconductor device includes a second deep layer between a first deep layer and first current distribution layer and a base region in an active region and in a part of an inactive region adjacent to the active region. The second deep layer has a second stripe portion including lines connecting to the base region and the first deep layer. The semiconductor device further includes a second current distribution layer between the first current distribution layer and the base region and arranged between the lines of the second stripe portion. The first deep layer has a first stripe portion including a plurality of lines, and each line has an end portion connecting to a frame-shaped portion and an inner portion on an inner side of the end portion. The width of the end portion is equal to or greater than the inner portion.

21 Claims, 23 Drawing Sheets

(51) Int. Cl.
     *H10D 62/17*       (2025.01)
     *H10D 62/832*     (2025.01)

(56)           References Cited

U.S. PATENT DOCUMENTS

| | | | |
|---|---|---|---|
| 2014/0175459 A1* | 6/2014 | Yamamoto | H10D 62/051 |
| | | | 257/77 |
| 2019/0334030 A1* | 10/2019 | Takeuchi | H10D 30/665 |
| 2020/0161467 A1 | 5/2020 | Takeuchi et al. | |
| 2020/0168732 A1* | 5/2020 | Mitani | H10D 30/60 |

\* cited by examiner

FIG. 3

SEMICONDUCTOR DEVICE

CROSS REFERENCE TO RELATED APPLICATIONS

The present application is a continuation application of International Patent Application No. PCT/JP2022/013846 filed on Mar. 24, 2022, which designated the U.S. and claims the benefit of priority from Japanese Patent Application No. 2021-082800 filed on May 14, 2021. The entire disclosures of all of the above applications are incorporated herein by reference.

TECHNICAL FIELD

The present disclosure relates to a semiconductor device having a trench gate structure.

BACKGROUND

Conventionally, a trench gate structure having a high channel density for allowing a large amount of current has been adopted in a silicon carbide (SiC) semiconductor device or the like. In the SiC semiconductor device having the trench gate structure, the dielectric breakdown of a gate insulating film may occur due to the application of an electric field stress to a bottom portion of a trench. For this reason, there has been proposed a SiC semiconductor device that suppresses the dielectric breakdown of the gate insulating film by suppressing the application of the high electric field to the bottom portion of the trench.

SUMMARY

The present disclosure describes a semiconductor device having an active region formed with a semiconductor switching element having a plurality of trench gate structures and being operated as an element, and an inactive region surrounding the active region and being not operated as the element. In an aspect of the present disclosure, the switching element of the semiconductor device includes: a semiconductor region of a first or second conductivity type; a first impurity region of the first conductivity type, disposed above the semiconductor region and having an impurity concentration lower than that of the semiconductor region; a base region of the second conductivity type, disposed above the first impurity region; a second impurity region of the first conductivity type, disposed above the base region and having an impurity concentration higher than that of the first impurity region; the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region; a first electrode electrically connected to the second impurity region and electrically connected to the base region; and a second electrode disposed on a back side of the semiconductor region opposite to the first impurity region and electrically connected to the semiconductor region. Further, the semiconductor device includes: a first current distribution layer of the first conductivity type, disposed between the first impurity region and the base region and having an impurity concentration higher than that of the first impurity region; a first deep layer of the second conductivity type, including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion; a second deep layer of the second conductivity type, including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer; and a second current distribution layer of the first conductivity type disposed between the first current distribution layer and the base region, and arranged between the plurality of lines of the second stripe portion.

BRIEF DESCRIPTION OF DRAWINGS

Features and advantages of the present disclosure will become more apparent from the following detailed description made with reference to the accompanying drawings, in which:

FIG. 3 is a diagram illustrating a top layout of the SiC semiconductor device when viewed from the top in FIG. 2;

DETAILED DESCRIPTION

Figure 1:
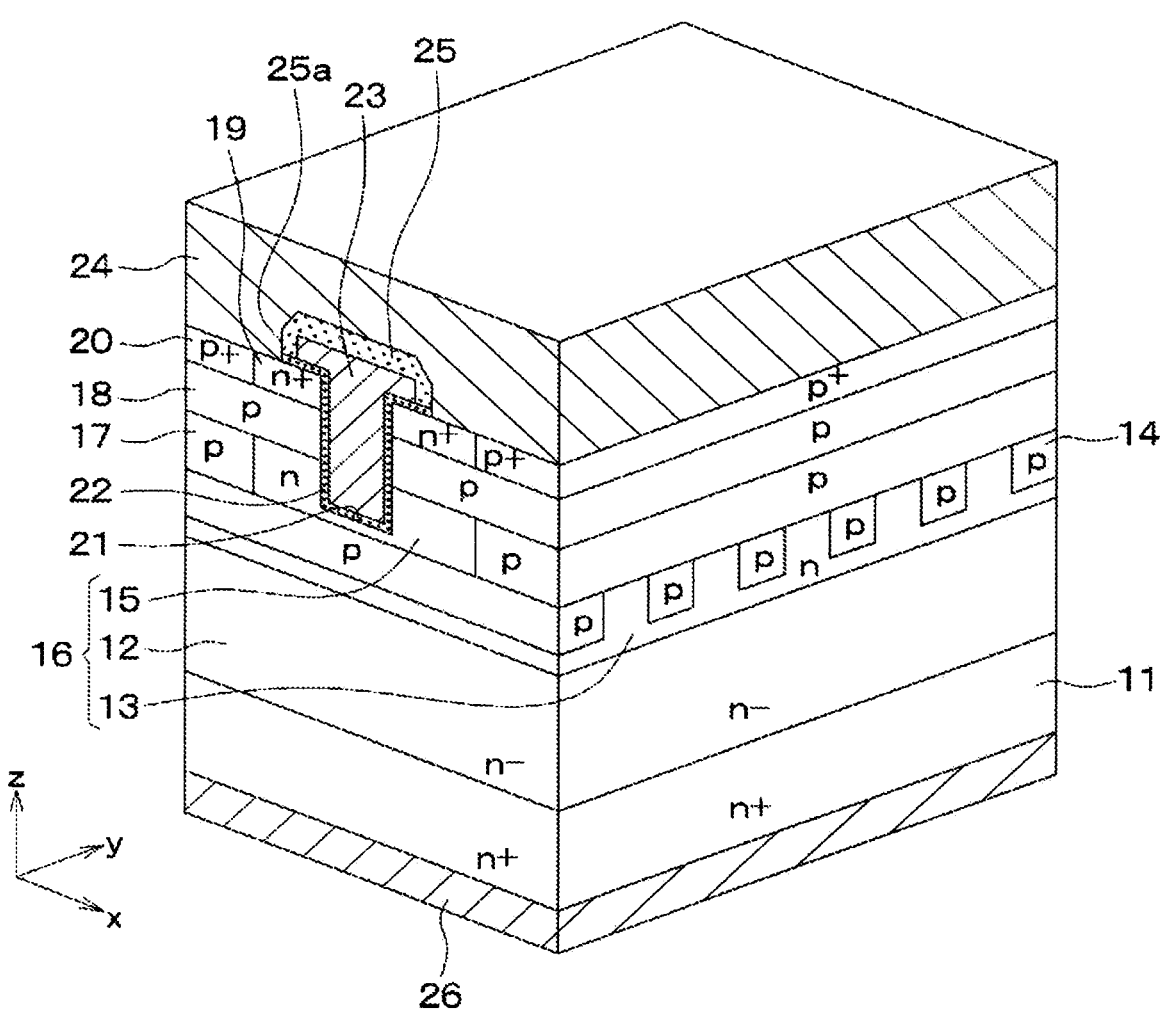
FIG. 1 is a diagram illustrating a perspective and cross-sectional view of a SiC semiconductor device according to a first embodiment.

In a SiC semiconductor device having a trench gate structure, the dielectric breakdown of a gate insulating film may occur due to the application of an electric field stress to a bottom portion of a trench. In order to suppress the dielectric breakdown of the gate insulating film, a SiC semiconductor device that suppresses the application of the high electric field to the bottom portion of the trench has been proposed.

The proposed SiC semiconductor device has a structure in which an n-type first current distribution layer and a p-type first deep layer are alternately arranged into a stripe shape below the trench gate structure. The first deep layer is connected to a p-type base region via second deep layers disposed on both sides of the trench gate structure and is fixed to a source potential.

In such a structure, the first deep layer restricts the equipotential line from rising toward the trench gate structure. Since the high electric field is suppressed from being applied to the bottom portion of the trench gate structure, the dielectric breakdown of the gate insulating film can be suppressed.

In a cell region in which the trench gate structure is formed, a region in which the element operation is performed is referred to as an active region, and a remaining region in which the element operation is not performed is referred to as an inactive region. The inactive region is arranged to surround the active region. In regard to the structure of the proposed SiC semiconductor device, the inventors of the present disclosure have studied on a configuration in which the first deep layer is formed in a wide range of the inactive region so as to suppress the rising of the equipotential line based on the electric field relaxation effect of the first deep layer.

As a result, it was confirmed that a portion that does not form the first deep layer is widened at a connecting part where a portion (hereinafter, referred to as a stripe portion) of the first deep layer formed into a stripe shape in the cell region and a portion (hereinafter referred to as a frame-shaped portion) of the first deep layer in the outer peripheral region surrounding the stripe portion are connected to each other. When there is the widened portion that does not form the first deep layer, the electric field relaxation effect is reduced at the part, and the rising of the equipotential line cannot be suppressed. As a result, there is a concern that the gate life is reduced.

In addition, it was confirmed that the interval between the frame-shaped portion and the stripe portion, more specifically, the interval between a part of the frame-shaped portion parallel to the stripe portion and the outermost line of the stripe portion disposed to face the part of the frame-shaped portion was wider than the interval between the lines of the stripe portion. Even between the part of the frame-shaped portion and the stripe portion where the interval is widened, the electric field relaxation effect is reduced, and the rising of the equipotential line cannot be suppressed. As such, there is a concern that the gate life is reduced.

Further, in a case where the first deep layer and the second deep layer are each formed into a stripe shape and the first deep layer and the second deep layer intersect with each other, a portion of the first deep layer intersecting with the trench gate structure becomes a hindrance factor of the current path. As a result, there is a drawback that the on-resistance is increased.

Moreover, in the SiC semiconductor device having the n-type drift layer and the p-type base region, it was confirmed that the forward voltage Vf fluctuates due to the influence of holes generated when the formed PN diode is energized.

Although the SiC semiconductor device using SiC as a semiconductor material is exemplified hereinabove, the same applies to a semiconductor device using a semiconductor material other than SiC.

The present disclosure provides a semiconductor device capable of suppressing a decrease in gate life due to rising of equipotential lines. The present disclosure also provides a semiconductor device capable of suppressing an increase in the on-resistance. The present disclosure further provides a semiconductor device capable of suppressing the fluctuation of the forward voltage Vf.

According to a first aspect of the present disclosure, a semiconductor device has an active region formed with a semiconductor switching element having a plurality of trench gate structures and being operated as an element, and an inactive region surrounding the active region and being not operated as the element. The switching element includes: a semiconductor region of a first or second conductivity type; a first impurity region of the first conductivity type, disposed above the semiconductor region and having an impurity concentration lower than that of the semiconductor region; a base region of the second conductivity type, disposed above the first impurity region; a second impurity region of the first conductivity type, disposed above the base region and having an impurity concentration higher than that of the first impurity region; the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region; a first electrode electrically connected to the second impurity region and electrically connected to the base region; and a second electrode disposed on a back side of the semiconductor region opposite to the first impurity region and electrically connected to the semiconductor region.

The semiconductor device further includes: a first current distribution layer of the first conductivity type, disposed between the first impurity region and the base region and having an impurity concentration higher than that of the first impurity region; and a first deep layer of the second conductivity type, including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion.

The semiconductor device further includes; a second deep layer of the second conductivity type, including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer; and a second current distribution layer of the first conductivity type disposed between the first current distribution layer and the base region, and arranged between the plurality of lines of the second stripe portion. In such a configuration, each of the plurality of lines of the first stripe portion has an end portion connecting to the frame-shaped portion and an inner portion located on an inner side of the end portion, and the end portion has a width equal to or greater than a width of the inner portion.

In this manner, the width of the end portion of each line of the first stripe portion of the first deep layer is equal to or greater than the width of the inner portion. That is, even if the portion of the mask used for forming the first deep layer corresponding to the end portion of the first deep layer is narrowed, the width of the end portion can be made equal to or greater than the width of the inner portion. Therefore, the end portion of the first current distribution layer can be restricted from being widened, and the rising of the electric field in the portion can be suppressed by the electric field relaxation effect of the first deep layer. As such, it is possible to suppress the decrease in the withstand voltage and the decrease in lifetime of the gate insulating film.

In a semiconductor device according to a second aspect of the present disclosure, each of the lines of the second stripe portion may have an end portion and an inner portion disposed on an inner side of the end portion, and the width of the end portion may be larger than the width of the inner portion.

In such a configuration, the width of the end portion of the second deep layer is greater than the width of the inner portion. For this reason, even if the electric field relaxation effect by the first deep layer is reduced due to the fact that the space between the frame-shaped portion and the stripe portion is larger than the space between the lines of the first deep layer, the equipotential line can be pushed back by the electric field relaxation effect of the second deep layer. As such, it is possible to make it difficult for a high electric field to enter. Accordingly, even if the space between the frame-shaped portion and the stripe portion of the first deep layer is larger than the interval between the lines, it is possible to suppress the occurrence of the rising of the electric field in this portion. Therefore, it is possible to suppress a decrease in the withstand voltage and a decrease in lifetime of the gate insulating film.

In a semiconductor device according to a third aspect of the present disclosure, the first direction, which is the longitudinal direction of the trench, may intersect with the second direction, which is the longitudinal direction of each line of the first stripe portion of the first deep layer. Each of the lines of the first stripe portion may be divided into divided portions at a missing portion to have a broken line shape, and the trench gate structure may pass through the missing portion of the respective lines of the first stripe shape.

In such a configuration, while the first stripe portion intersects with the trench gate structure, each line is partially divided by the missing portion, and the trench gate structure passes through the missing portion. In such a configuration, it is possible to reduce the number of intersections between the first deep layer and the trench gate structure as compared with a case where the missing portion is not provided. As such, it is possible to suppress an increase in on-resistance.

A semiconductor device according to a fourth aspect of the present disclosure may include, below the first deep layer and the first current distribution layer, a third deep layer of the second conductivity type including a third stripe portion having a plurality of lines extending in the first direction.

As described above, the deep layer has a three-layer structure including the third deep layer in addition to the first deep layer and the second deep layer. With such a structure, the movement path of carriers becomes long, and more carriers can be recombined and disappear. Accordingly, it is possible to suppress an increase in the on-resistance and a fluctuation in the forward voltage Vf.

Embodiments of the present disclosure will be described hereinafter with reference to the drawings. In the following description, the same or equivalent parts are denoted by the same reference numerals throughout the embodiments.

First Embodiment

A first embodiment will be described with reference to FIG. 1 to FIG. 4. As shown in FIGS. 1 to 4, a SiC semiconductor device of the present embodiment includes a cell region 1 in which a metal oxide semiconductor field effect transistor (MOSFET) having an inverted trench gate structure is formed as a semiconductor switching element, and an outer peripheral region 2 in which an outer peripheral voltage withstand structure is formed. The outer peripheral region 2 surrounds the cell region 1. FIG. 1 is a diagram illustrating a perspective and cross-sectional view of one cell in the cell region 1 of the MOSFET.

Figure 2:
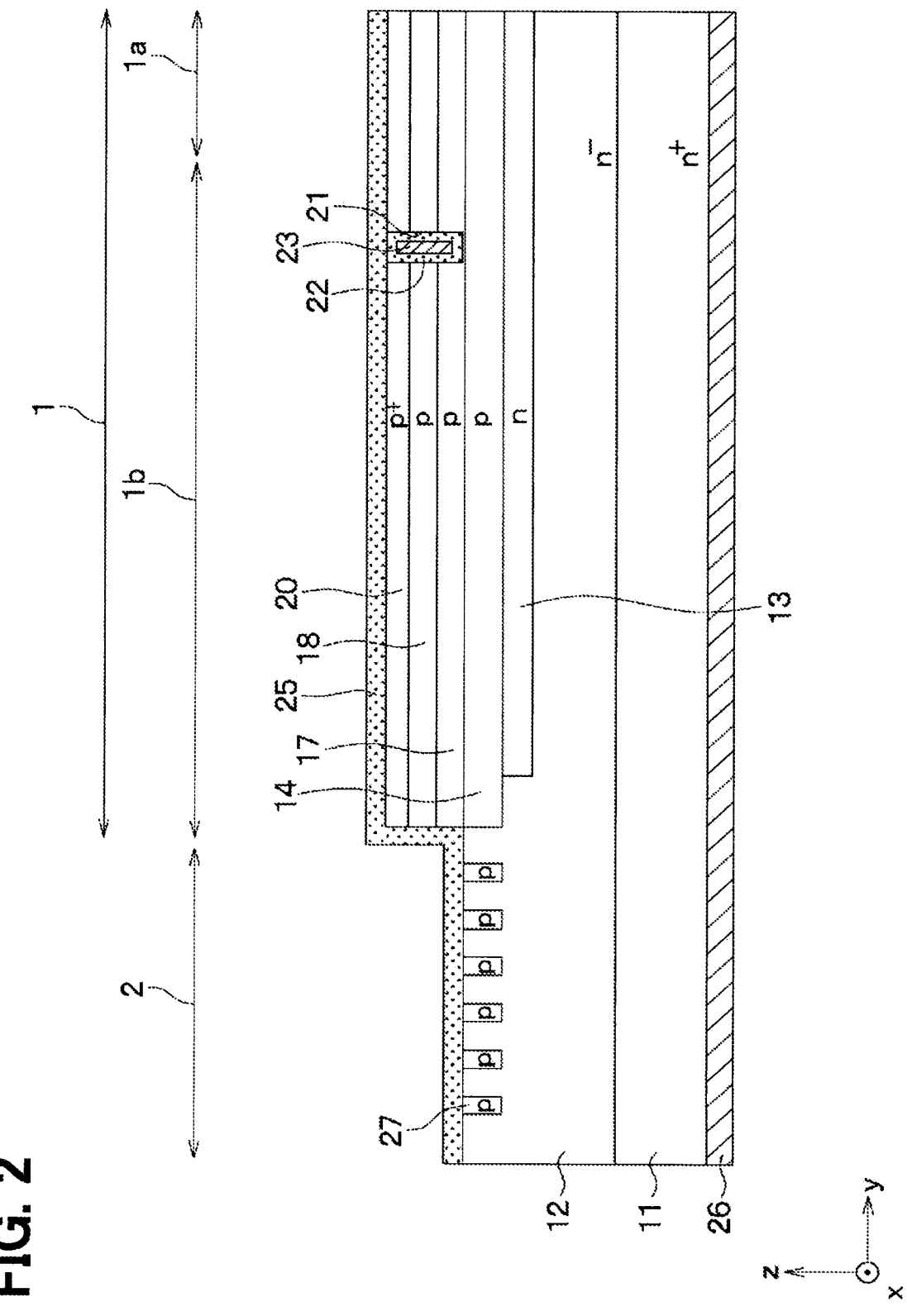
FIG. 2 is a diagram illustrating a cross-sectional view of an outer edge portion of a cell region and a peripheral region surrounding the cell region of the SiC semiconductor device, corresponding to a cross-section taken along a line II-II in FIG. 3.

As shown in FIGS. 1 and 2, the SiC semiconductor device is formed using an n$^+$-type substrate 11 made of SiC. For example, the substrate 11 has an off angle of 0 to 8° with respect to a (0001) Si plane, and has a concentration of an n-type impurity such as nitrogen or phosphorus of $1.0 \times 10^{19}/$ cm$^3$, and a thickness of about 300 μm.

Figure 3:
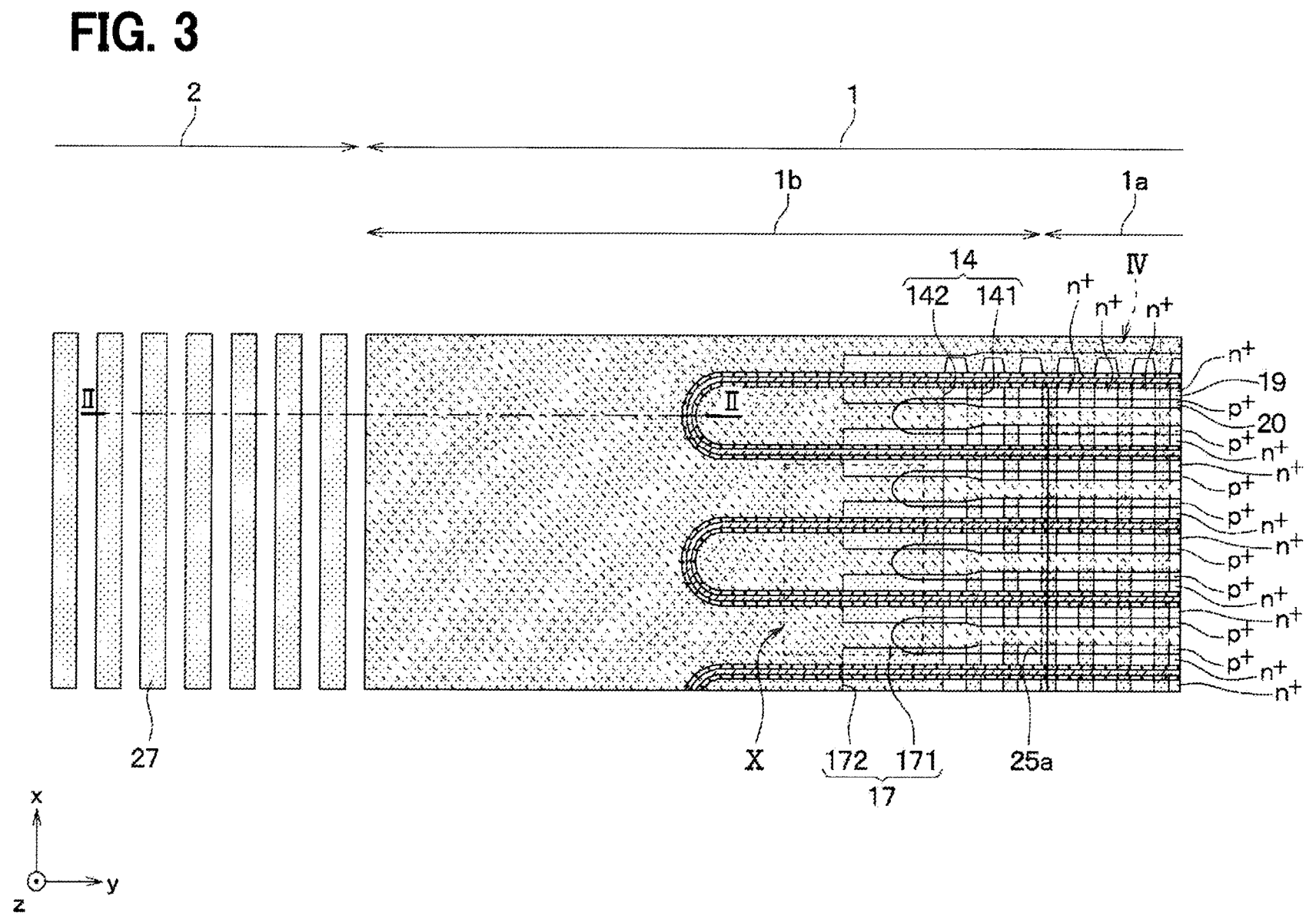

In FIGS. 1 to 3, the substrate 11 has a planar direction along an xy-plane. The substrate 11 has a <11-20> direction along a y-axis direction in the xy-plane, and a direction orthogonal to the y-axis direction in the xy-plane is referred to an x-axis direction. A direction normal to the planar direction of the substrate 11 is referred to as a z-axis direction.

An n$^-$-type layer 12 made of SiC is formed on a surface of the substrate 11. The n$^-$-type layer 12 contains an n-type impurity such as nitrogen or phosphorus, and a concentration of the n-type impurity is, for example, $5.0 \times 10^{15}$ to $10.0 \times 10^{15}/$cm$^3$. The n$^-$-type layer 12 has a thickness of about 10 μm to 15 μm. Although the impurity concentration of the n$^-$-type layer 12 may be kept constant in a depth direction, the n$^-$-type layer 12 preferably has an inclined concentration distribution so that the concentration on the side of the substrate 11 is higher than that on the side further from substrate 11. For example, in the n$^-$-type layer 12, the impurity concentration at a depth of about 3 to 5 μm from the surface of the substrate 11 is preferably higher by about $2.0 \times 10^{15}/$cm$^3$ than that in other portions. With the configuration described above, an internal resistance of the n$^-$-type layer 12 can be reduced, and the on-resistance can be reduced. In the present embodiment, the n$^-$-type layer 12 corresponds to a first impurity region.

In the cell region 1, an n$^-$-type first current distribution layer 13 into which an n-type impurity such as nitrogen or phosphorous is introduced and a p-type first deep layer 14 into which a p-type impurity such as aluminum (Al) is introduced are formed in a surface layer portion of the n$^-$-type layer 12. The n-type first current distribution layer 13 has an impurity concentration higher than that of the n$^-$-type layer 12.

The first current distribution layer 13 is formed of an n-type layer containing an n-type impurity such as nitrogen or phosphorus and has a depth of 0.3 to 1.5 μm. In the present embodiment, the first current distribution layer 13 is formed only in the cell region 1. In other words, in the present embodiment, a region in which the first current distribution layer 13 is formed in the surface layer portion of the n$^-$-type layer 12 is the cell region 1, and a region in which the first current distribution layer 13 is not formed in the surface layer portion of the n$^-$-type layer 12 is the outer peripheral region 2. The first deep layer 14 is shallower than the first current distribution layer 13 but has a depth of approximately 0.3 to 1.4 μm, which is substantially the same as the depth of the first current distribution layer 13. That is, the first deep layer 14 is formed such that the bottom portion is located within the first current distribution layer 13 and has a depth so that the first current distribution layer 13 is present between the bottom portion of the first deep layer 14 and the n$^-$-type layer 12.

In an active region 1a in which the MOSFET is operated as the element, the first current distribution layer 13 and the first deep layer 14 are disposed to have a plurality of lines extending along the x-axis direction and the lines of the first current distribution layer 13 and the lines of the first deep layer 14 are alternately arranged at equal intervals in the y-axis direction so as to form a stripe pattern. The portions of the first deep layer 14 forming the stripe pattern correspond to a first stripe portion, and hereinafter referred to as a stripe portion 141.

Each line of the first current distribution layer 13 forming the stripe shape has the width of 0.25 μm, for example, and the n-type impurity concentration of $5.0 \times 10^{16}$ to $2.0 \times 10^{18}/$cm$^3$, for example. Each line of the stripe portion 141 has the width of 0.9 μm, for example, and has the p-type impurity concentration of $3.0 \times 10^{17}$ to $1.0 \times 10^{18}/$cm$^3$. In the case of the present embodiment, the first deep layer 14 has a constant p-type impurity concentration in the depth direction. The surface of the first deep layer 14 on the side opposite to the n$^-$-type layer 12 is flush with the surface of the first current distribution layer 13.

As shown in FIG. 3, the first deep layer 14 is also formed in an inactive region 1b which is located between the active region 1a and the outer peripheral region 2 so as to surround the active region 1a and in which the element operation of the MOSFET is not performed. In an inner area of the inactive region 1b close to the active region 1a, the first deep layer 14 has the stripe portion 141 similar to those in the active region 1a. In an outer area of the inactive region 1b on an outer side of the inner area, the first deep layer 14 is formed entirely up to a boundary position with the outer peripheral region 2 so as to form a frame-shaped portion 142. The frame-shaped portion 142 is connected to the respective lines of the stripe portion 141 while surrounding the stripe portion 141.

Figure 4:
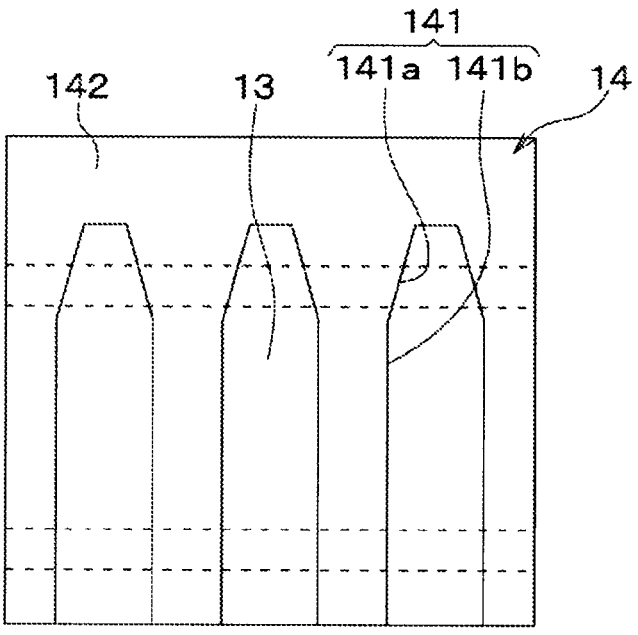
FIG. 4 is a diagram illustrating a top layout of a boundary position between a stripe portion and a frame-shaped portion of a first deep layer in a region IV surrounded by a broken line in FIG. 3.

In the present embodiment, the first deep layer 14 is formed by ion implantation as described later. In consideration of the processing limit of photolithography at the time of ion implantation, the width of each line constituting the stripe portion 141, that is, the length in the y-axis direction is set to 0.3 μm or more, and is, for example, 0.9 μm as described above. Although described later in detail, the width of each line of the stripe portion 141 (hereinafter simply referred to as the width of the first deep layer 14) is set, as shown in FIG. 4, so that the width at both end portions 141a is equal to or greater than the width of an inner portion 141b located on the inner side of the end portions 141a. The width of the inner portion 141b is, for example, 0.9 μm, and the width of the end portions 141a is equal to or greater than the width of the inner portion 141b. Therefore, the interval between the lines of the stripe portion 141, that is, the width of the first current distribution layer 13 along the y-axis direction (hereinafter simply referred to as the width of the first current distribution layer 13) is set so that the width of both end portions is equal to or smaller than the width of an inner portion located inside the end portions. In FIG. 4, a trench gate structure, which will be described later, is indicated by a broken line. In this case, a layout in which the end portions 141a and the trench gate structure overlap with each other is employed. However, the end portions 141a and the trench gate structure do not necessarily overlap with each other.

A second current distribution layer 15 is formed on the first current distribution layer 13 and the first deep layer 14. The second current distribution layer 15 contains an n-type impurity, such as nitrogen or phosphorous, and has an n-type impurity concentration of, for example, $1.0 \times 10^{16}$ to $5.0 \times 10^{17}/cm^3$, and a thickness of 0.5 to 2 μm. In the present embodiment, the n⁻-type layer 12 and the first current distribution layer 13 constitute the drift layer 16 together with the second current distribution layer 15.

In the second current distribution layer 15, a plurality of second deep layers 17 are formed so as to penetrate the second current distribution layer 15. The second deep layer 17 contains a p-type impurity, such as Al, and has a p-type impurity concentration of, for example, $2.0 \times 10^{17}$ to $2.0 \times 10^{18}/cm^3$, and a thickness equal to that of the second current distribution layer 15. In the present embodiment, the second deep layers 17 extend along the y-axis direction and are arranged at equal intervals along the x-axis direction so as to form a stripe pattern including a plurality of lines in the active region 1a in which the MOSFET is operated as the element. The portions of the second deep layers 17 forming the stripe pattern correspond to a second stripe portion and are hereinafter referred to as a stripe portion 171. Each line of the stripe portion 171 of the second deep layer 17 extends in a direction intersecting the stripe portion 141 of the first deep layer 14, and each line of the stripe portion 171 has a width of, for example, 0.7 to 1.6 μm.

As shown in FIG. 3, the second deep layer 17 is also formed in the inactive region 1b located between the active region 1a and the outer peripheral region 2. In an inner area of the inactive region 1b close to the active region 1a, the second deep layer 17 has a structure in which the stripe portions 171 are formed similar to those in the active region 1a. In an outer area of the inactive region 1b on an outer side of the inner area, the second deep layer 17 is formed entirely up to a boundary position with the outer peripheral region 2 so as to form a frame-shaped portion 172. The frame-shaped portion 172 is connected to each line of the stripe portion 171 while surrounding the stripe portion 171.

Each second deep layer 17 is connected to the first deep layer 14 at a position where the stripe portion 171 intersects with the stripe portion 141 and at a position where the frame-shaped portion 172 overlaps with the frame-shaped portion 142. The stripe portion 171 is formed so as to interpose a trench 21, which will be described later, therebetween. That is, the stripe portion 171 is formed apart from the trench 21. In addition, since the second current distribution layer 15 is in a state disposed between the lines of the stripe portion 171 of the second deep layer 17, the second current distribution layer 15 also has a stripe shape.

A p-type base region 18 is formed on the second current distribution layer 15 and the second deep layers 17. An n⁺-type source region 19 and a p⁺-type contact layer 20 are formed on the base region 18. The source region 19 is disposed on both sides of a trench gate structure, which will be described later, and the contact layers 20 are disposed opposite to the trench gate structure across the source regions 19. In the present embodiment, the source regions 19 correspond to a second impurity region.

For example, the base region 18 has a p-type impurity concentration of $5.0 \times 10^{16}$ to $2.0 \times 10^{19}/cm^3$ and a thickness of about 0.5 μm. The source region 19 contains an n-type impurity such as nitrogen or phosphorous and has an n-type impurity concentration in a surface layer portion, that is, a surface concentration of $1.0 \times 10^{20}/cm^3$, for example. The source region 19 has a thickness of about 0.3 μm, for example. The contact layer 20 contains a p-type impurity such as Al and has a p-type impurity concentration in a surface layer portion, that is, a surface concentration of $1.0 \times 10^{21}/cm^3$, for example. The contact layer 20 has a thickness of about 0.3 μm, for example.

The trench 21 is formed so as to penetrate the base region 18 and the source region 19 to reach the second current distribution layer 15 and to have a bottom surface within the second current distribution layer 15. The trench 21 has a width of, for example, 0.5 to 1.0 μm. The trench 21 is formed so as not to reach the first current distribution layer 13 and the first deep layer 14. That is, the trench 21 is formed so that the first current distribution layer 13 and the first deep layer 14 are present under the bottom surface of the trench 21. Since the trench 21 is formed to penetrate the base region 18 and the source region 19, the base region 18 and the source region 19 are in contact with the side surfaces of the trench 21.

The trench 21 is filled with a gate insulating film 22 that is formed on the inner wall surface of the trench 21, and a gate electrode 23 that is made of doped Poly-Si and formed on the surface of the gate insulating film 22. Thus, the trench gate structure is formed. Although not particularly limited, the gate insulating film 22 is formed by thermally oxidizing the inner wall surface of the trench 21 and has a thickness of about 100 nm at both the side surfaces and the bottom surface of the trench 21.

The trench 21 extends in the y-axis direction in FIG. 1. That is, the trench 21 has a longitudinal direction along a <11-20> direction. Since the trench 21 extends in the <11-20> direction in this manner, the (1-100) plane, which is the side wall surface of the trench 21, can be used as a channel. As such, the influence of the channel mobility dependency can be reduced. Further, as shown in FIG. 3, multiple trenches 21 are arranged in the x-axis direction to have a stripe pattern. In addition, the trenches 21 form a semicircular shape at end portions thereof. Adjacent two of the trenches 21 are paired up and connected to each other at the end portions into the semicircular shape. The source region 19 and the contact layer 20 described above extend along the extending direction of the trenches 21.

A source electrode 24 and a gate wiring (not shown) are formed on surfaces of the source region 19 and the contact layer 20 and a surface of the gate electrode 23. In the present embodiment, the source electrode 24 corresponds to a first electrode.

The source electrode 24 and the gate wiring are made of multiple metals, such as Ni and Al. Portions of the source electrode 24 and the gate wiring that are in contact with the n-type SiC, that is, the portions in contact with the source region 19 and the gate electrode 23 in the case of the n-type doping are at least made of a metal capable of coming in an ohmic contact with the n-type SiC. Portions of the source electrode 24 and the gate wiring that are in contact with the p-type SiC, that is, the portions in contact with the contact layer 20 and the gate electrode 23 in the case of the p-type doping are at least made of a metal capable of coming in an ohmic contact with p-type SiC.

The source electrode 24 and the gate wiring are electrically insulated from each other by being formed on an interlayer insulating film 25. The source electrode 24 is electrically connected to the source region 19 and the contact layer 20 through a contact hole 25a formed in the interlayer insulating film 25. As a result, the first deep layer 14 is maintained at the same potential as that of the source electrode 24 through the contact layer 20, the base region 18, and the second deep layer 17. The gate wiring is electrically connected to the gate electrode 23 through the contact hole 25a formed in the interlayer insulating film 25 in a cross-section different from that shown in FIGS. 1 and 2.

A drain electrode 26 is formed on a bask surface side of the substrate 11 and is electrically connected to the substrate 11. In the present embodiment, the substrate 11 functions as a drain layer. In the present embodiment, the drain electrode 26 corresponds to a second electrode.

As described above, the cell region 1 is formed with the MOSFET having an n-channel type inverted trench gate structure. As shown in FIG. 3, in the cell region 1, a region in which the trench gate structures, the source regions 19, and the contact layers 20 are formed is provided as the active region 1a, and a region between the active region 1a and the outer peripheral region 2 is provided as the inactive region 1b, and thus the element operation of the MOSFET is performed in the active region 1a.

The outer peripheral region 2 is provided so as to surround the active region 1a and the inactive region 1b of the cell region 1. As shown in FIGS. 2 and 3, in the outer peripheral region 2, the second deep layer 17 formed in the cell region 1 is extended above the n⁻-type layer 12. Multiple p-type guard rings 27 that are connected to the second deep layer 17 and surround the cell region 1 are formed in the surface layer portion of the n⁻-type layer 12. In the present embodiment, the guard ring 27 has the same impurity concentration and the same depth as those of the first deep layer 14.

The SiC semiconductor device of the present embodiment has configurations as described above. Next, the width of the first deep layer 14 and the width of the first current distribution layer 13 will be described in detail.

As described above, the first deep layer 14 has the stripe portion 141 including multiple lines in the active region 1a. In addition, the first deep layer 14 has the frame-shaped portion 142, in the inactive region 1b, that is formed on the entire surface up to the boundary position with the outer peripheral region 2 except for the inner area of the inactive region 1b close to the active region 1a. In each line of the stripe portion 141 of the first deep layer 14, the width of both end portions 141a is equal to or greater than the width of the inner portion 141b. That is, the width of both end portions of the first current distribution layer 13 is equal to or less than the width of the inner portion between the end portions thereof.

In the present embodiment, the width of the inner portion 141b is set to be a constant dimension, for example, 0.9 µm, and the width of the end portions 141a gradually increases toward the distal end. Specifically, the width of the end portion 141a is gradually increased toward the distal end, that is, toward the frame-shaped portion 142 so that both sides separates from each other at an equal rate in the width direction, and the width of the most distal end of the end portion 141a, that is, the width of the furthest end from the inner portion 141b is larger than the width of the inner portion 141b by about 0.1 to 0.2 µm on each side. Therefore, both sides of the end portion 141a in the width direction are linear. Since the width of the end portion 141a gradually increases toward the distal end, conversely, the width of the end portion of the first current distribution layer 13 gradually decreases toward the distal end, and the end portion of the first current distribution layer 13 has a trapezoidal shape.

Next, the operation of the SiC semiconductor device configured as described above will be described.

First, in the SiC semiconductor device, an inversion layer is not formed in the base region 18 in an off state before a gate voltage is applied to the gate electrode 23. For that reason, even if a positive voltage, for example, 1600 V, is applied to the drain electrode 26, electronics do not flow from the source region 19 into the base region 18, and no current flows between the source electrode 24 and the drain electrode 26.

In addition, in a state before the gate voltage is applied to the gate electrode 23, an electric field is applied between the drain and the gate, and an electric field concentration may occur at a bottom of the gate insulating film 22. However, the SiC semiconductor device described above have the first deep layer 14 and the first current distribution layer 13 at positions deeper than the trench 21. Therefore, a depletion layer formed between the first deep layer 14 and the first current distribution layer 13 restricts the high electric field due to the influence of the drain voltage from entering the gate insulating film 22. In particular, by setting the width of the end portion 141a of the first deep layer 14 to be equal to or greater than the width of the inner portion 141b, the width of the end portion of the first current distribution layer 13 is set to be equal to or less than the width of the inner portion thereof. Therefore, it is possible to suppress rising of the equipotential line caused by a wide width of the end portion of the first current distribution layer 13, and it is thus possible to further restrict the high electric field from entering the gate insulating film 22. Therefore, in the present embodiment, breakdown of the gate insulating film 22 can be suppressed.

When a predetermined gate voltage, for example, 20 V, is applied to the gate electrode 23, a channel is formed in a surface of the base region 18 that is in contact with the trench 21. For that reason, the electrons injected from the source electrode 24 pass through the channel extending from the source region 19 to the base region 18, and then flow into the second current distribution layer 15. The electrons flowing into the second current distribution layer 15 further pass through the first current distribution layer 13 to the n⁻-type layer 12, and then pass through the substrate 11 as the drain layer to flow into the drain electrodes 26. As a result, a current flows between the source electrode 24 and the drain electrode 26, and the SiC semiconductor device is turned on. In the present embodiment, the electrons that have passed through the channel flow into the substrate 11 through the second current distribution layer 15, the first current distribution layer 13, and the n⁻-type layer 12. Therefore, the second current distribution layer 15, the first current distribution layer 13, and the n⁻-type layer 12 constitute the drift layer 16.

Next, a method of manufacturing the SiC semiconductor device of the present embodiment will be described with reference to FIGS. 5A to 5G. FIGS. 5A to 5G are perspective and cross-sectional views of a portion corresponding to the portion shown in FIG. 1 during a manufacturing process.

Figure 5A:
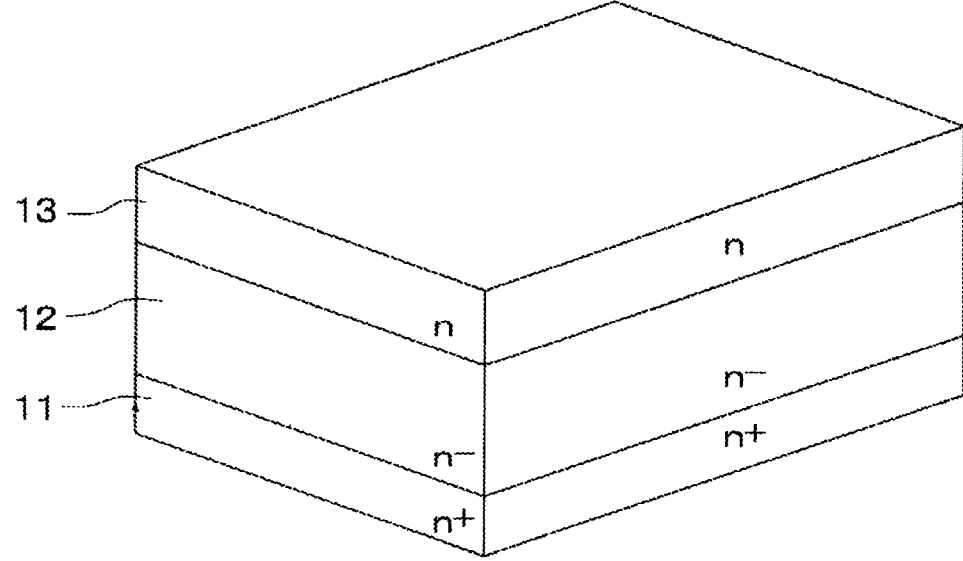
FIG. 5A is a diagram illustrating a cross-sectional view for showing a manufacturing process of the SiC semiconductor device shown in FIG. 1.

First, as shown in FIG. 5A, an n⁺-type substrate 11 is prepared. Then, an n⁻-type layer 12 made of SiC is epitaxially grown on the surface of the substrate 11. Next, a mask (not shown) is formed on the surface of the n⁻-type layer 12, and the mask is patterned by photolithography or the like so that a region where the first current distribution layer 13 is to be formed is opened. Specifically, the mask is patterned so that only a portion corresponding to the cell region 1 is opened. Then, an n-type impurity such as nitrogen or phosphorus is ion-implanted from the top of the mask and a thermal treatment is performed, so that the first current distribution layer 13 is formed only in the cell region 1. Thereafter, the mask is removed. As the mask, for example, a low temperature oxide (LTO) film or the like is used. In the present embodiment, a mask is used also in a subsequent process, which will be described later, and an LTO film or the like is used for each mask, for example.

In the present embodiment, as described above, the first current distribution layer 13 is formed by the ion implantation. For that reason, as compared with the case in which the first current distribution layer 13 is formed of an epitaxial film, the impurity concentration of the first current distribution layer 13 can be easily controlled, and variations in characteristics can be suppressed.

Figure 5B:
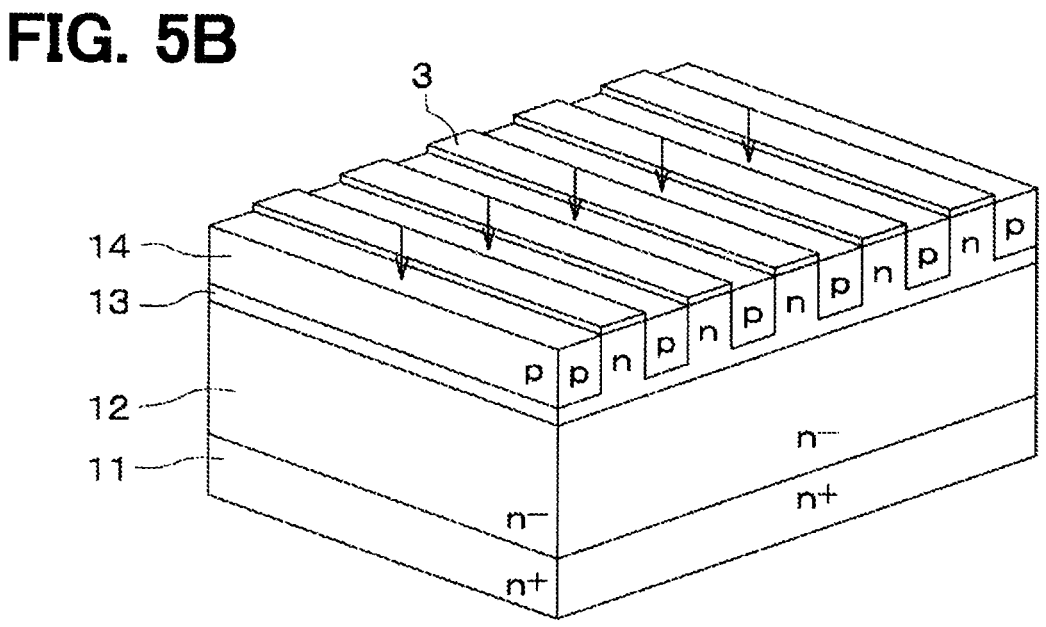
FIG. 5B is a diagram illustrating a cross-sectional view for showing a manufacturing process of the SiC semiconductor device subsequent to the process shown in FIG. 5A.
Figure 5C:
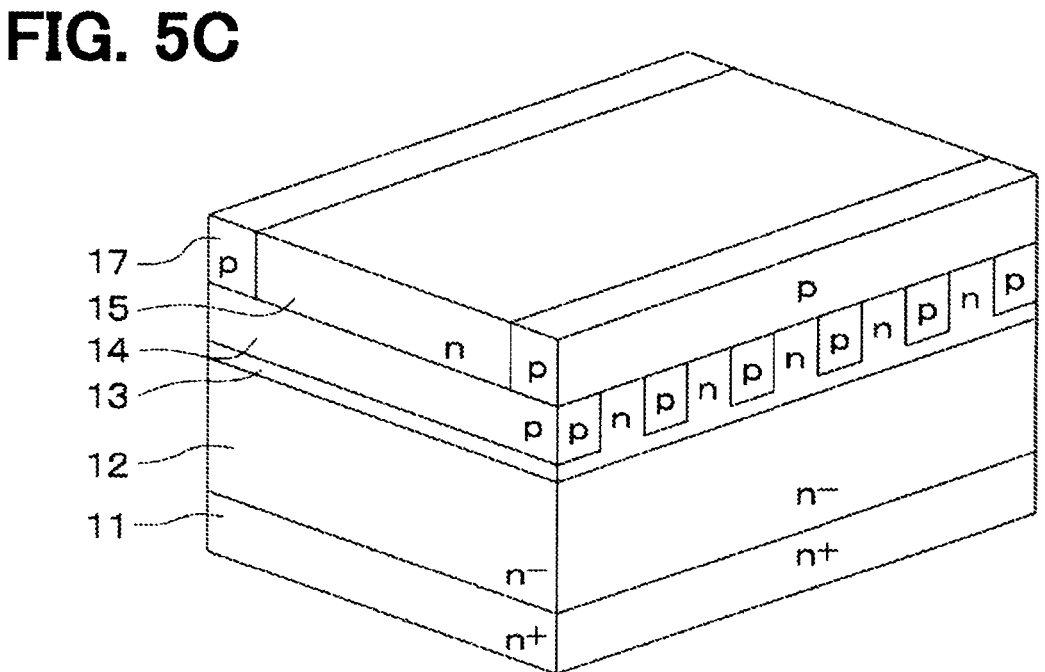
FIG. 5C is a diagram illustrating a cross-sectional view for showing a manufacturing process of the SiC semiconductor device subsequent to the process shown in FIG. 5B.

Next, as shown in FIG. 5B, a mask 3 is formed, and is patterned by photolithography or the like so that a region where the first deep layer 14 is to be formed is opened. In this case, although the outer peripheral region 2 is not illustrated, the mask 3 is also opened in a region where the guard ring 27 is to be formed. Then, a p-type impurity such as Al is ion-implanted from the top of the mask 3 and a thermal treatment is performed, so that the first deep layer 14 and the guard ring 27 are formed. In this case, the first deep layer 14 and the guard ring 27 are formed in the same process. However, the first deep layer 14 and the guard ring 27 may be formed in separate processes.

In the present embodiment, the width of the end portion 141a of each line of the stripe portion 141 of the first deep layer 14 is equal to or greater than the width of the inner portion 141b. That is, the mask 3 is designed to have the layout shown in FIG. 4, so that the opening of the mask 3 has a larger width at a portion corresponding to the end portion 141a than at a portion corresponding to the inner portion 141b. As such, even if the width of the end portion 141a is made smaller than the design value, the width of the end portion 141a can be kept equal to or larger than the width of the inner portion 141b.

Figure 6A:
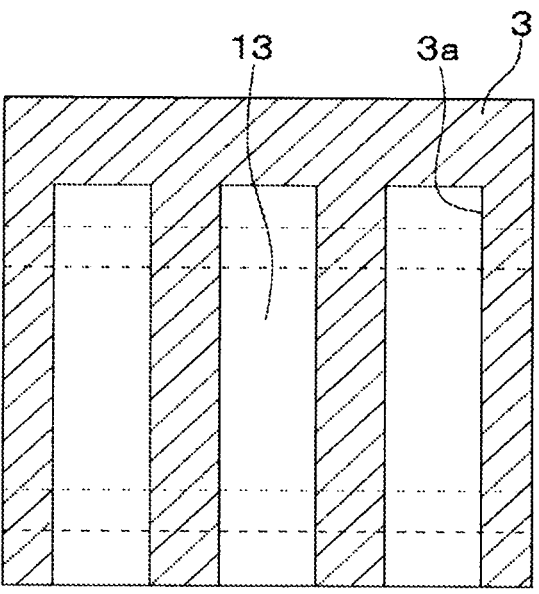
FIG. 6A is a diagram illustrating a design example of a mask pattern used to form a first deep layer.
Figure 6B:
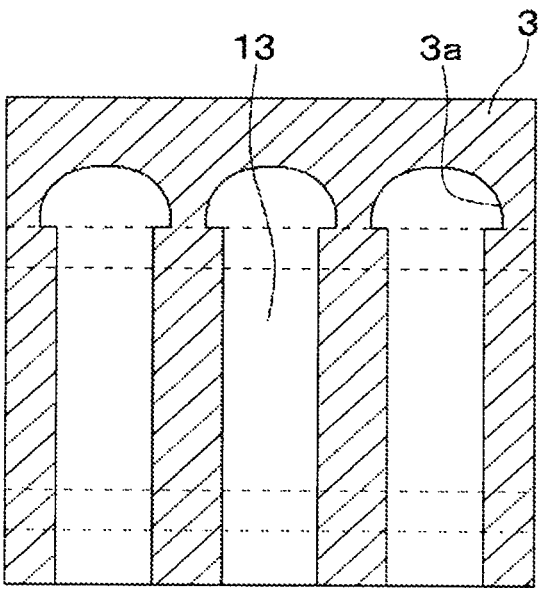
FIG. 6B is a diagram illustrating a design value of the mask when the mask is patterned based on the design example of the mask pattern shown in FIG. 6A.
Figure 6C:
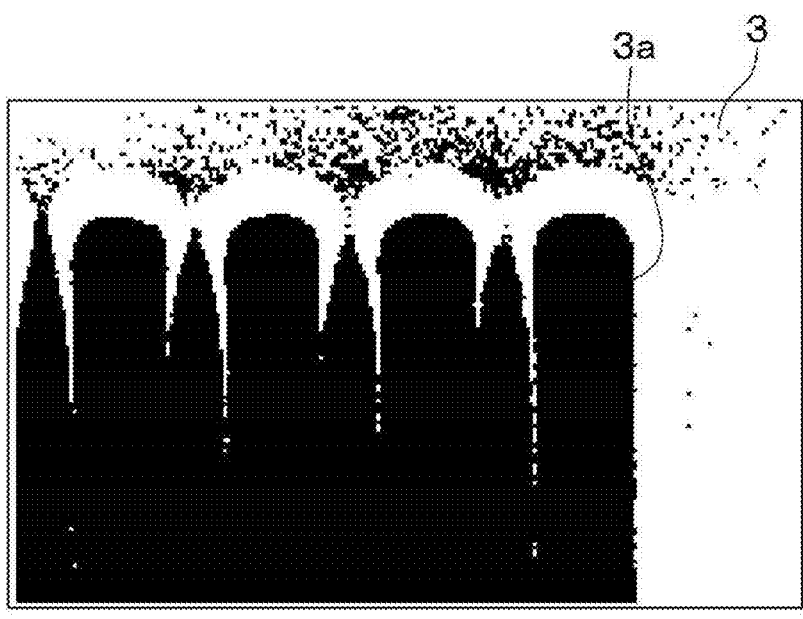
FIG. 6C is a diagram illustrating an image of the mask when the mask is actually patterned based on the design example of the mask pattern shown in FIG. 6A.

As shown in FIG. 6A, if the mask 3 is designed such that each line of the stripe portion 141 has the same width at the end portion 141a as the inner portion 141b, the design value of the mask 3 after patterning has a shape as shown in FIG. 6B. That is, as shown in FIG. 6B, a portion of the opening 3a of the mask 3 corresponding to the end portion 141a is narrowed, and the mask 3 remains in a semicircular shape at a position corresponding to the end portion of the first current distribution layer 13. FIG. 6C shows the workability of the actual mask 3, and it can be understood that the portion of the opening 3a of the mask 3 corresponding to the end portion 141a is narrowed. A white portion surrounding the periphery of the opening 3a indicates a portion where the mask 3 remains in a tapered shape. Although FIGS. 6A and 6B are not cross-sectional views, hatching is shown in a portion to be the opening of the mask 3 for easy understanding.

Figure 7:
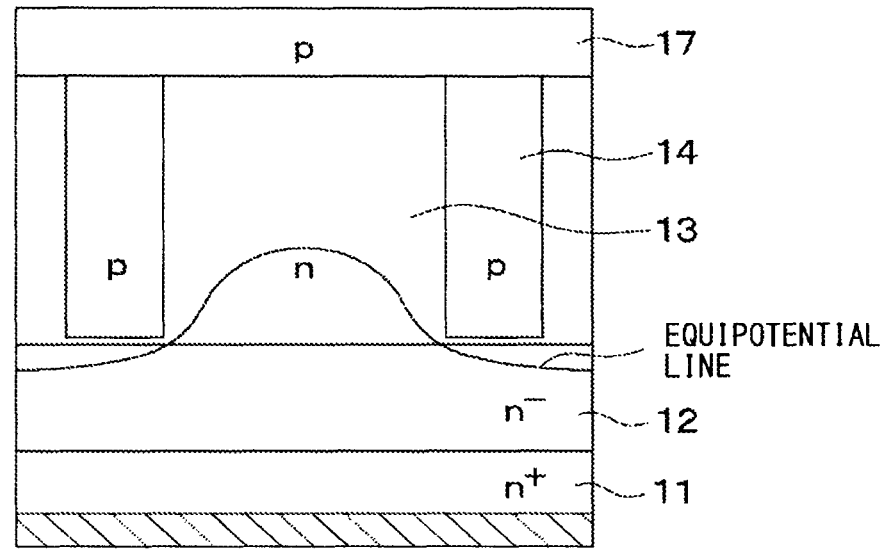
FIG. 7 is a diagram illustrating a state of rising of an electric field in cross-section.

As described above, since the portion of the opening 3a of the mask 3 corresponding to the end portion 141a remains narrow, when the p-type impurity is ion-implanted using the mask 3, the end portion 141a is formed to have a narrower width than the inner portion 141b. Therefore, the end portion of the first current distribution layer 13 is widened, and as shown in FIG. 7, the rising of the electric field cannot be restricted in this portion. As a result, a leakage between the drain and the source occurs, the withstand voltage decreases, and the voltage increases at the bottom portion of the trench gate structure. Then, a withstand voltage reduction region is partially generated, so the avalanche resistance and the switching resistance cannot be obtained, resulting in decrease in the lifetime of the gate insulating film 22.

Such a phenomenon occurs because the density of a reaction solution during the etching of a resist at the time of patterning the mask 3 is lower in the vicinity of the end portion 141a than in the other portions, and the resist remains, so that the opening along the shape of the end portion 141a cannot be formed. Since the mask 3 remains in a semicircular shape at a position corresponding to the end portion of the first current distribution layer 13, the width of the end portion 141a of each line of the stripe portion 141 becomes narrow. Actually, when it was confirmed how much the interval between the end portions 141a of the lines of the stripe portion 141 was increased, the interval was increased by 40 to 50% with respect to the design value.

Figure 8A:
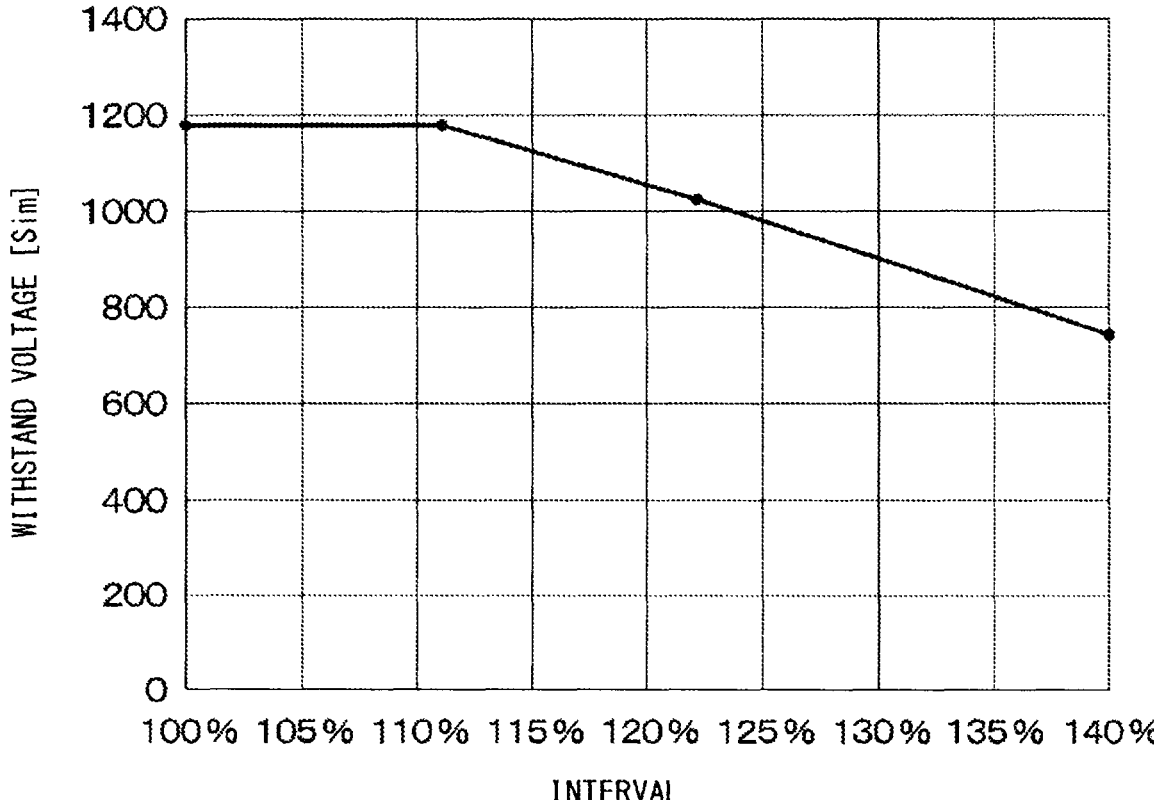
FIG. 8A is a diagram illustrating a relationship between an interval between lines of the stripe portion of the first deep layer and a withstand voltage.
Figure 8B:
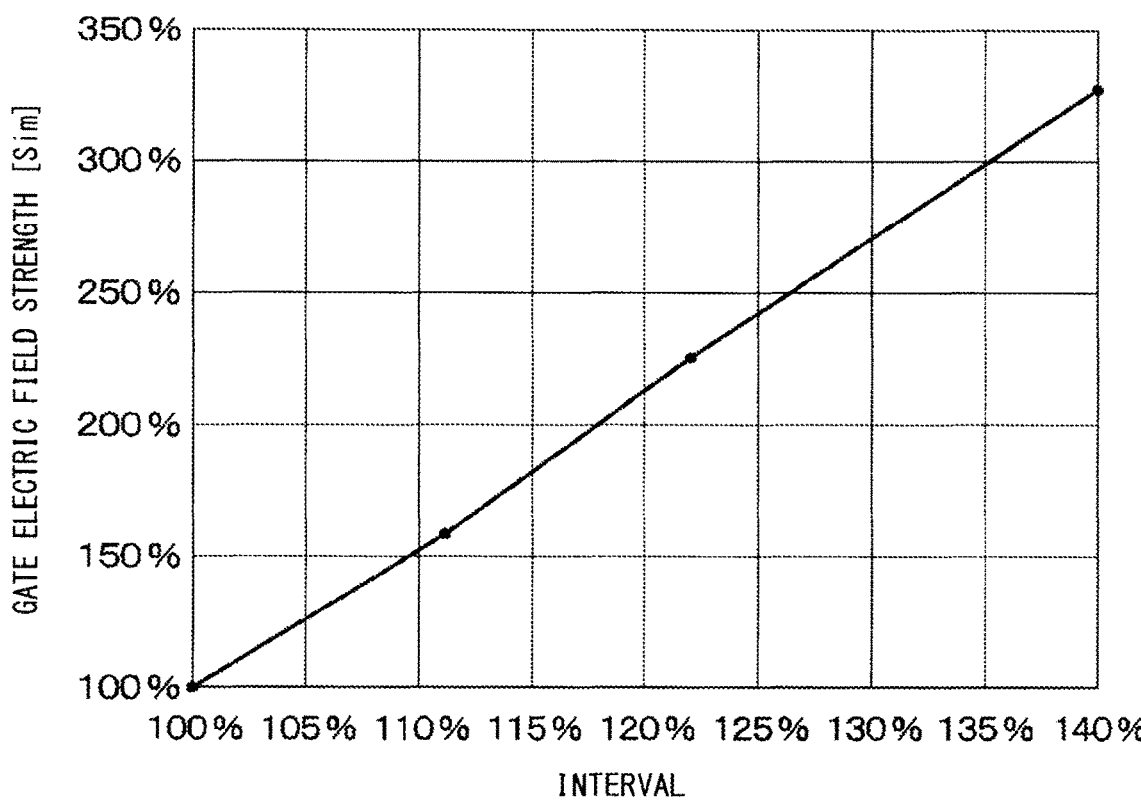
FIG. 8B is a diagram illustrating a relationship between an interval between the lines of the stripe portion of the first deep layer and a gate electric field strength.

The relationship between the interval of the lines of the stripe portion 141 and the withstand voltage and the electric field strength applied to the gate insulating film 22 are examined by simulation. Specifically, the withstand voltage and the electric field strength applied to the gate insulating film 22 when the interval of the lines is increased are calculated on the assumption that the interval of the lines of the design value is defined as 100%. FIGS. 8A and 8B show the simulation results. As shown in FIGS. 8A and 8B, it is found that when the interval of the lines is increased by 40% with respect to the design value, that is, when the interval is 140%, the withstand voltage is decreased by about 400 V with respect to 1200 V of the design value, and the electric field strength applied to the gate insulating film 22 is increased to about 330%. From these simulation results, there is a concern that the life of the gate insulating film 22 may be shortened.

On the other hand, in the present embodiment, the width of the opening of the mask 3 corresponding to the end portion 141a is set to be larger than the width of the portion corresponding to the inner portion 141b, so that the width of the end portion 141a becomes equal to or larger than the width of the inner portion 141b even when the width of the end portion 141a becomes smaller than the design value. Therefore, it is possible to suppress the end portion of the first current distribution layer 13 from being widened, and it is possible to restrict the rising of the electric field in the portion. As such, it is possible to suppress a decrease in withstand voltage and a decrease in the lifetime of the gate insulating film 22.

Subsequently, as shown in FIG. 5 C, the second current distribution layer 15 made of SiC is epitaxially grown above the n⁻-type layer 12, the first current distribution layer 13, and the first deep layer 14. As a result, the drift layer 16 having the n⁻-type layer 12, the first current distribution layer 13, and the second current distribution layer 15 is formed.

Next, a mask (not shown) is formed, and is patterned by photolithography or the like so that a region where the second deep layer 17 is to be formed is opened. Then, a p-type impurity such as Al is ion-implanted from the top of the mask and a thermal treatment is performed to form the second deep layer 17. In this case, the second deep layer 17 is extended in a direction intersecting with the extension direction of the first deep layer 14. For that reason, even if there is some positional deviation in forming the second deep layer 17, it is possible to suppress an occurrence of a problem that the first deep layer 14 and the second deep layer 17 are not connected to each other.

Figure 5D:
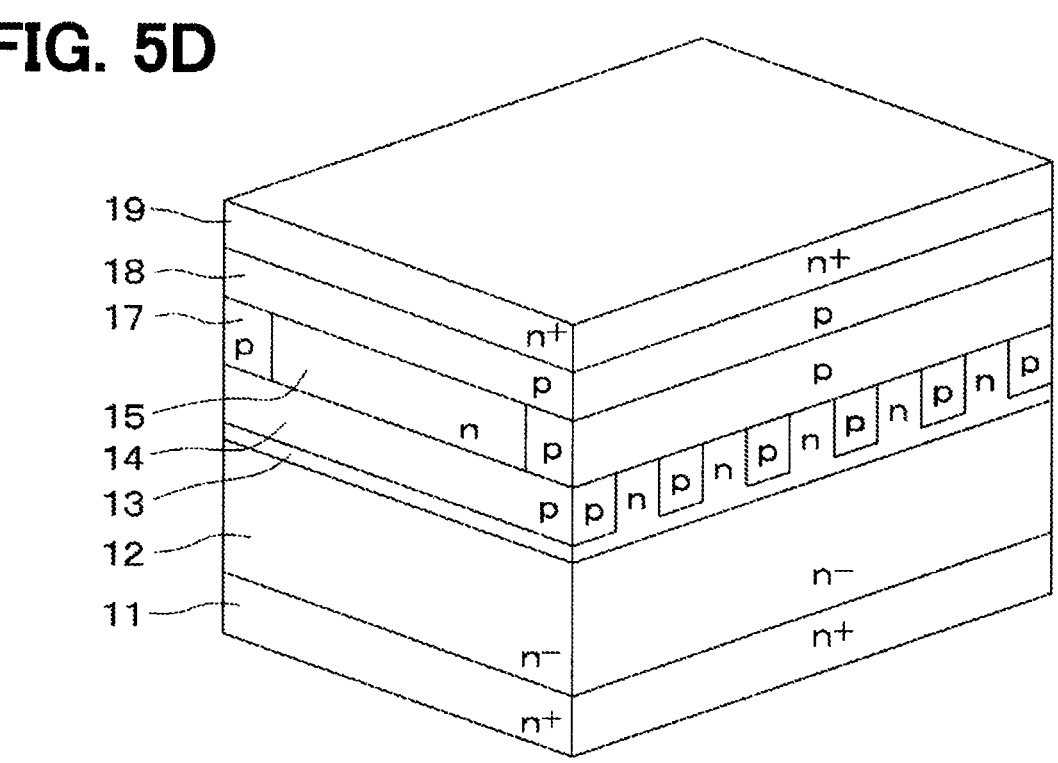
FIG. 5D is a diagram illustrating a cross-sectional view for showing a manufacturing process of the SiC semiconductor device subsequent to the process shown in FIG. 5C.

Next, as shown in FIG. 5D, a p-type impurity layer is epitaxially grown on the second current distribution layer 15 and the second deep layer 17 to form the base region 18. Subsequently, an n-type impurity layer is epitaxially grown on the base region 18 to form the source region 19.

Figure 5E:
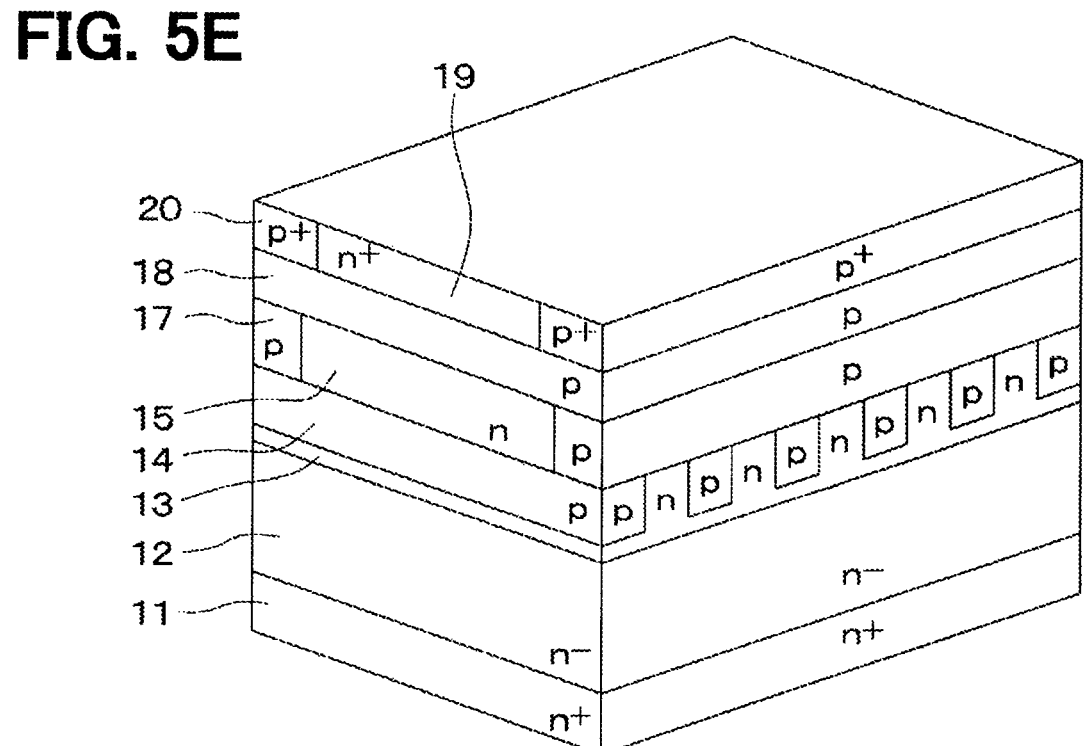
FIG. 5E is a diagram illustrating a cross-sectional view for showing a manufacturing process of the SiC semiconductor device subsequent to the process shown in FIG. 5D.

Then, as shown in FIG. 5E, a mask (not shown) is formed, and is patterned by photolithography or the like so that a region where the contact layer 20 is to be formed is opened. Further, a p-type impurity such as Al is ion-implanted from the top of the mask and a thermal treatment is performed to form the contact layer 20.

Figure 5F:
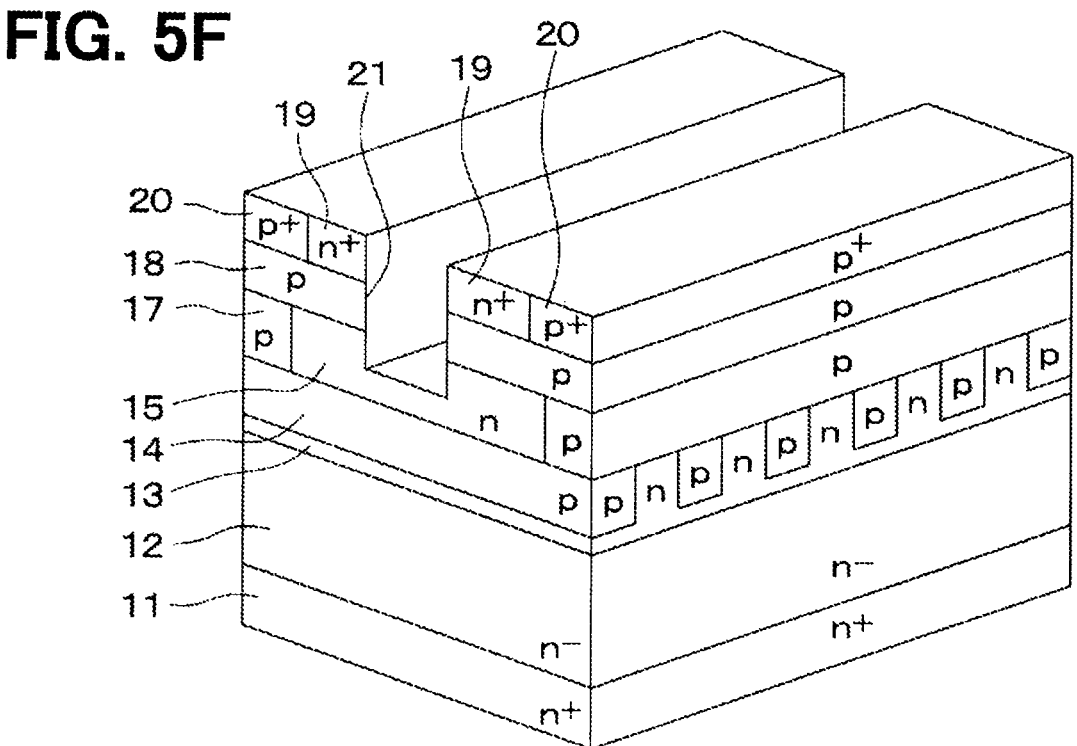
FIG. 5F is a diagram illustrating a cross-sectional view for showing a manufacturing process of the SiC semiconductor device subsequent to the process shown in FIG. 5E.

Next, as shown in FIG. 5F, after a mask (not shown) is formed, the mask is patterned so that a region where the trench 21 is to be formed is opened. Then, anisotropic etching is performed to form the trench 21. More specifically, the trench 21 is formed so as to penetrate the source region 19 and the base region 18, so that the bottom of the trench 21 is located within the second current distribution layer 15. In other words, the trench 21 is formed so that the first current distribution layer 13 and the first deep layers 14 are located below the bottom surface of the trench 21. After the anisotropic etching, isotropic etching or sacrificial layer oxidation may be performed as necessary.

Figure 5G:
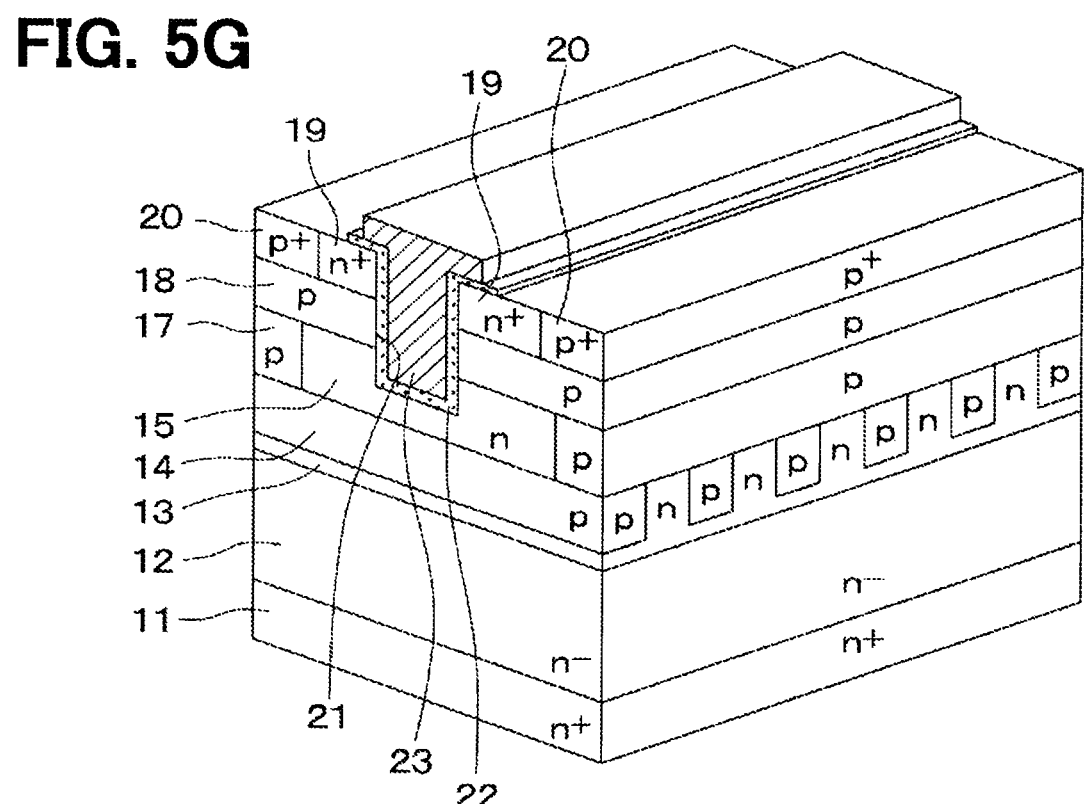
FIG. 5G is a diagram illustrating a cross-sectional view for showing a manufacturing process of the SiC semiconductor device subsequent to the process shown in FIG. 5F.

Next, as shown in FIG. 5G, the gate insulating film 22 is formed in a location including the inside of the trench 21. For example, the gate insulating film 22 is formed by thermal oxidation, specifically, gate oxidation by a pyrogenic method using a wet atmosphere. Subsequently, a polysilicon layer doped with an n-type impurity is formed on the surface of the gate insulating film 22 to a thickness of about 440 nm at a temperature of, for example, 600° C., and then an etch-back process or the like is performed so that the gate insulating film 22 and the gate electrode 23 remain in the trench 21. As a result, the trench gate structure is formed.

Although not shown, the subsequent processes are performed in a similar manner to a related art. For example, a process for forming the interlayer insulating film 25, a process for forming the contact hole 25a, a process for forming the source electrode 24 and the gate wiring, and a process for forming the drain electrode 26 on the back surface side of the substrate 11 are performed. In this way, the SiC semiconductor device of the present embodiment is manufactured.

In the present embodiment, as described above, for each line of the stripe portion 141 of the first deep layer 14, the width of the end portion 141a is equal to or greater than the width of the inner portion 141b. That is, even if the portion of the mask 3 corresponding to the end portion 141a is narrowed, the width of the end portion 141a can be equal to or greater than the width of the inner portion 141b. Therefore, it is possible to restrict the end portion of the first current distribution layer 13 from being widened, and to suppress the rising of the electric field in that portion. As a result, it is possible to suppress a decrease in withstand voltage and a decrease in lifetime of the gate insulating film 22.

Modifications of First Embodiment

Figure 9A:
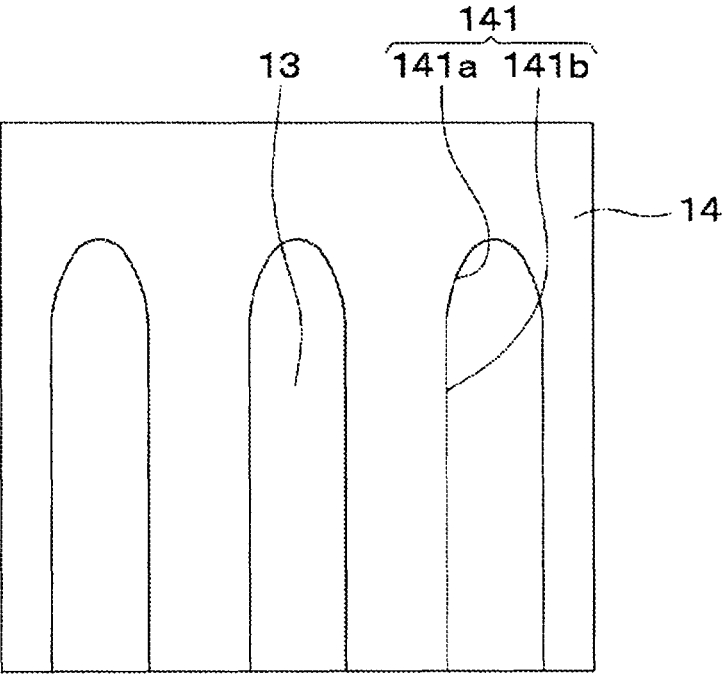
FIG. 9A is a diagram illustrating a top layout of a stripe portion of a first deep layer according to a modification of the first embodiment.
Figure 9B:
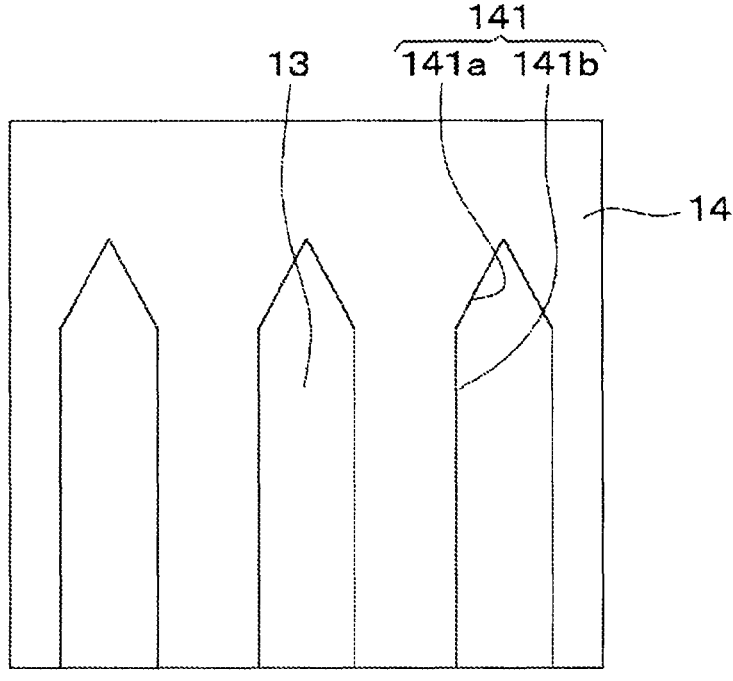
FIG. 9B is a diagram illustrating a top layout of a stripe portion of a first deep layer according to a modification of the first embodiment.

In the first embodiment described above, the width of the end portion 141a is gradually increased toward the distal end, and each side of the end portion 141a in the width direction have a straight line shape. In other words, the end portion of the first current distribution layer 13 has a trapezoidal shape. As a modification, as shown in FIG. 9A, the width of the end portion 141a may be gradually increased toward the distal end, so that both sides of the end portion 141a in the width direction may have a curved shape such as an elliptical arc shape. For example, the end portion of the first current distribution layer 13 may have an elliptical shape including a circular shape. As another modification, as shown in FIG. 9B, each side of the end portion 141a in the width direction may have a straight line shape, so that the end portion of the first current distribution layer 13 may have a triangular shape. Further, both sides of the end portion 141a in the width direction may not have the same shape or may be widened in different manners.

In the first embodiment, the longitudinal direction of each line of the stripe portion 141 is orthogonal to the longitudinal direction of the trench gate structure. Alternatively, the longitudinal direction of each line of the stripe portion 141 may not be orthogonal but may intersect with the longitudinal direction of the trench gate structure or be parallel to the longitudinal direction of the trench gate structure. Note that in the case where the longitudinal direction of each line in the stripe portion 141 is parallel to the longitudinal direction of the trench gate structure, the pitch, which is the formation interval, of the lines of the stripe portion 141 may be equal to that of the second deep layer 17.

Second Embodiment

A second embodiment will be described hereinafter. In the present embodiment, the layout of the stripe portion 171 of the second deep layer 17 is specified with respect to the first embodiment. The other configurations of the second embodiment are similar to those of the first embodiment, and thus only a configuration different from the first embodiment will be described.

In the first embodiment, the configuration has been taken against the reduction in the gate life due to the increase in the width of the end portion of the first current distribution layer 13 in accordance with the decrease in the width of the end portion of each line of the stripe portion 141. As described above, it was also confirmed that the interval between the frame-shaped portion 142 and the stripe portion 141 was wider than the interval between the lines of the stripe portion 141. Since the rising of the equipotential line cannot be suppressed even between the frame-shaped portion 142 and the stripe portion 141 in which the interval is widened, there is a concern that the gate life may be reduced. In the present embodiment, a countermeasure is taken against the decrease in the gate life.

Figure 10:
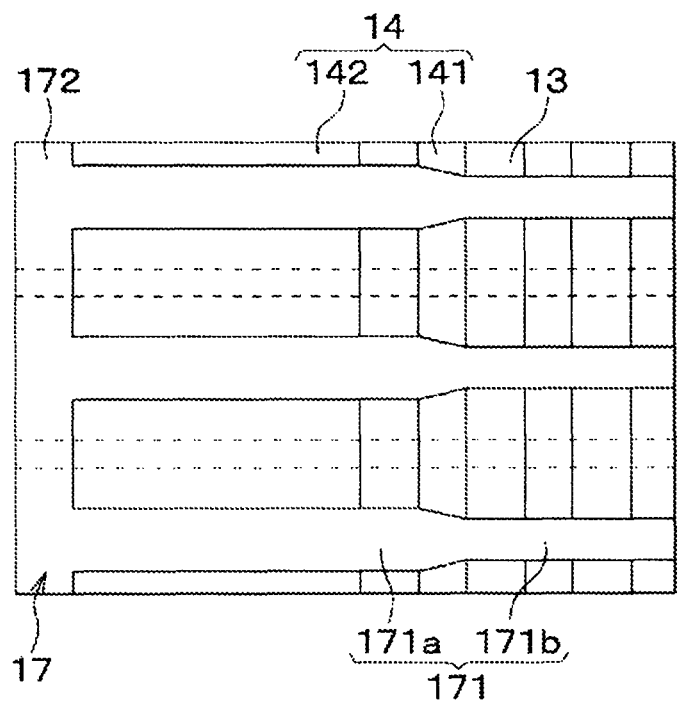
FIG. 10 is a diagram illustrating a top layout of a second deep layer of a SiC semiconductor device, corresponding to a region X indicated by a broken line in FIG. 3, according to a second embodiment.

As shown in FIG. 10, in the present embodiment, the end portion 171a of each line of the stripe portion 171 of the second deep layer 17 is wider than the inner portion 171b thereof positioned on the inner side. That is, the width of the second current distribution layer 15 is narrower at both end portions than at the inner portion. For example, the width of the inner portion 171b is about 0.7 to 1.6 μm, and the width of the end portion 171a is gradually increased on both sides in the width direction from the inner portion 171b toward the end portion and then is constant. Therefore, the second current distribution layer 15 has a rectangular shape in which the end portion has a constant width, and the corner portion of the end portion has an angle of 90°. The rate of increase in the width of the end portion 171a with respect to the inner portion 171b is arbitrary, but is preferably increased at about 10 to 30%, for example, by about 0.1 μm on each side in the width direction. The end portion 171a of the second deep layer 17 is a portion located in the inactive region 1b. In the inactive region 1b, the width of the end portion 171a is wider than the width of the inner portion 171b.

The start point at which the width of the end portion 171a increases is arbitrary, but it is preferable that the width of the end portion 171a begins to increase from the line of the stripe portion 141 of the first deep layer 14, the line being positioned closest to the frame-shaped portion 142.

As described above, the interval between the frame-shaped portion 142 and the stripe portion 141 may be wider than the interval between the lines of the stripe portion 141. Even between the frame-shaped portion 142 and the stripe portion 141 where the interval is widened, the rising of the equipotential line cannot be suppressed, and there is a possibility that the gate life is reduced.

In consideration to this, in the present embodiment, the width of the end portion 171a of the second deep layer 17 is equal to or greater than the width of the inner portion 171b. Therefore, it is possible to narrow the interval of the second deep layer 17 between the frame-shaped portion 142 and the stripe portion 141. Therefore, even when the electric field relaxation effect by the first deep layer 14 is reduced due to the expansion between the frame-shaped portion 142 and the stripe portion 141, the equipotential line can be pushed back by the electric field relaxation effect of the second deep layer 17, and it is possible to suppress a high electric field from entering. Therefore, it is possible to suppress the decrease in withstand voltage and the decrease in lifetime of the gate insulating film 22.

Modifications of Second Embodiment

Figure 11A:
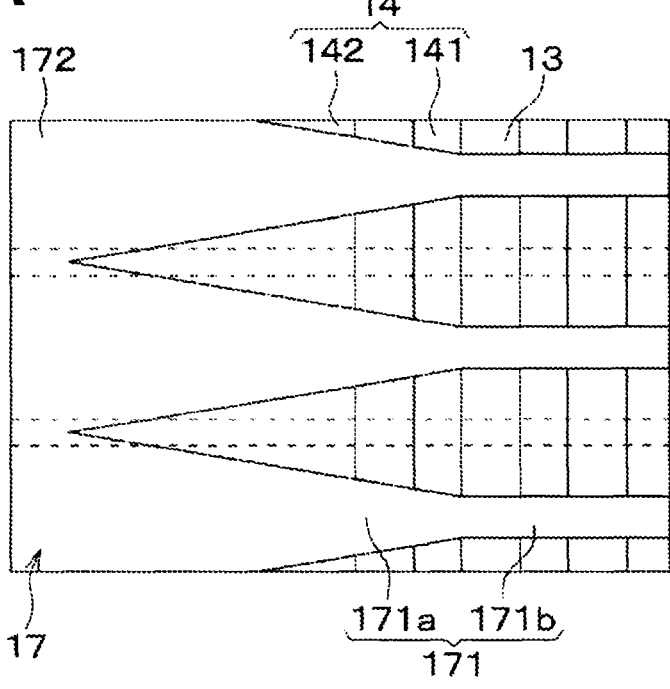
FIG. 11A is a diagram illustrating a top layout of a stripe portion of a second deep layer according to a modification of the second embodiment.
Figures 11B, 12:
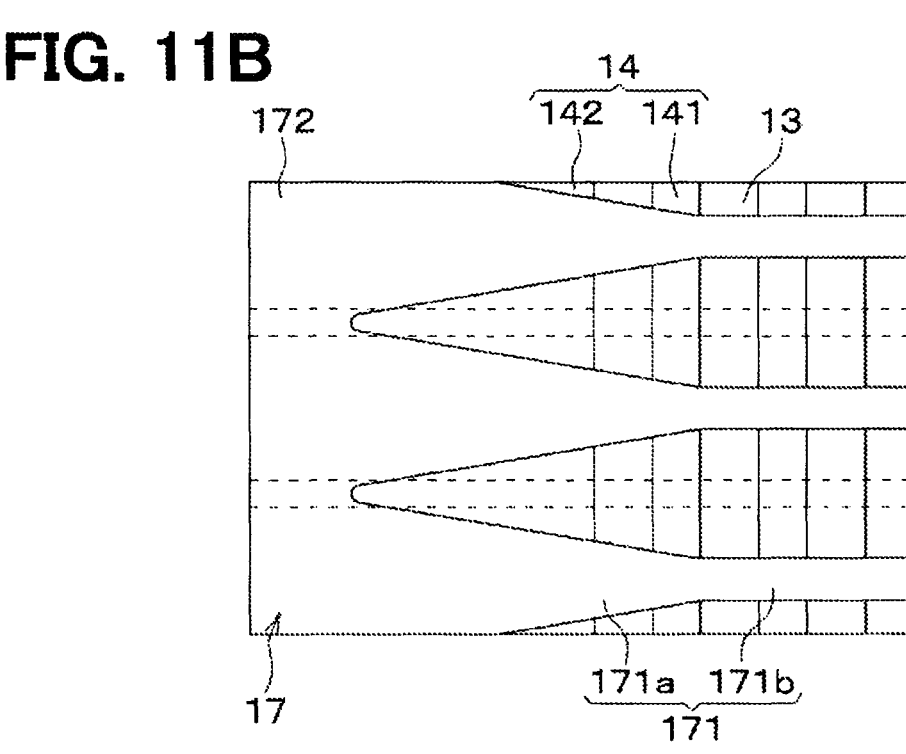
FIG. 11B is a diagram illustrating a top layout of a stripe portion of a second deep layer according to a modification of the second embodiment.
FIG. 12 is a diagram illustrating a top layout of a first deep layer, a second deep layer, and a trench gate structure of a SiC semiconductor device according to a third embodiment.

In the second embodiment described above, the width of the end portion 171a is gradually increased toward the distal end, and then is constant to the distal end, that is, toward the frame-shaped portion 172. In other words, the end portion of the second current distribution layer 15 has a rectangular shape so that the distal end has corners with an angle of 90 degrees. On the other hand, as shown in FIG. 11A, both sides of the end portion 171a in the width direction may be linear so that the distal end of the first current distribution layer 13 has a triangular shape. Alternatively, as shown in FIG. 11B, the width of the end portion 171a may be gradually increased toward the distal end, and both sides of the end portion 171a in the width direction may be curved into such as an arc shape. For example, the end of the first current distribution layer 13 may have an elliptical shape including a circular shape. Further, both sides of the end portion 171a in the width direction may not have the same shape or may have differently spreading shapes.

Third Embodiment

A third embodiment will be described hereinafter. In the present embodiment, the layout of the stripe portion 141 of the first deep layer 14 is changed from those of the first and second embodiments. The other configurations of the present embodiment are similar to those of the first or second embodiment. Therefore, only a configuration different from the first and second embodiments will be described.

In a case of the configuration in which the stripe portion 141 of the first deep layer 14 and the stripe portion 171 of the second deep layer 17 intersect with each other, a part of the stripe portion 141 intersecting with the trench gate structure becomes a hindrance factor of the current path. This results in an increase in the on-resistance. In the present embodiment, a countermeasure is taken against this increase in on-resistance.

As shown in FIG. 12, in the present embodiment, although the stripe portion 141 intersects with the trench gate structure, each line of the stripe portion 141 has divided rectangular strip portions that are divided by forming a missing portion 14a therebetween, so that each line has a broken line shape. Further, since the trench gate structure is formed to pass through the missing portion 14a, a current flow path is secured in that portion.

The location of the missing portion 14a in each line of the stripe portion 141 is arbitrary, but the missing portions 14a are preferably arranged in a staggered manner, as shown in FIG. 12. That is, between the adjacent lines, the missing portions 14a are formed so as to be shifted by the interval of the trench gate structure in the longitudinal direction of the lines, and every other one of the lines, that is, lines that are apart from each other across one line have the missing portions 14a at the locations corresponding to the same trench gate. In this way, it is possible to make the in-plane distribution of the arrangement of the missing portions 14a uniform while arranging every other line of the stripe portion 141 below each trench gate structure.

As described above, in the present embodiment, while the stripe portion 141 intersects with the trench gate structure, each line is partially divided into divided portions by providing the missing portion 14a therebetween, and the trench gate structure passes through the missing portion 14a. In this way, the number of intersections between the first deep layer 14 and the trench gate structure can be reduced as compared with the first and second embodiments, and it is thus possible to suppress the increase in on-resistance.

Figure 13:
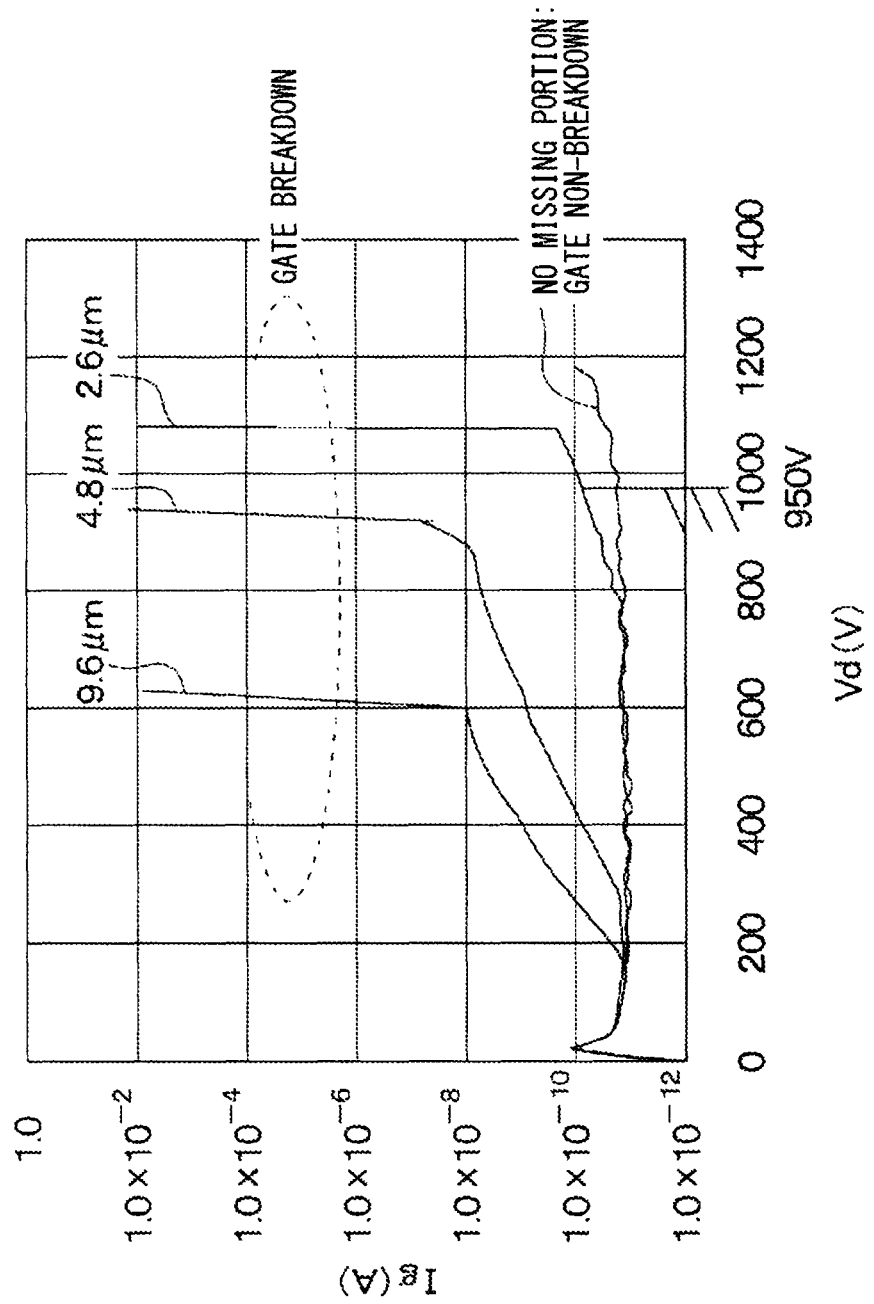
FIG. 13 is a diagram illustrating a relationship between a gate current Ig and a drain voltage Vd when a gate breakdown occurs.

Here, the size of the missing portion 14a in the stripe portion 141, that is, the interval between the lines divided in the longitudinal direction is preferably 2.6 μm or less. The withstand voltage was examined by changing the size of the missing portion 14a. Specifically, the drain voltage Vd when the gate breakdown occurred was confirmed based on the change in the gate current Ig. FIG. 13 is a diagram illustrating the results, and the results are extracted and illustrated when the intervals between lines are set to 2.6 μm, 4.8 μm, and 9.6 μm.

As shown in FIG. 13, the withstand voltage decreases as the interval between the lines increases. Assuming that a preferable withstand voltage for the SiC semiconductor device is 950 V, the withstand voltage can be satisfied if at least the interval between the lines is 2.6 μm or less. As a matter of course, the lower limit value of the interval between the lines may be set according to the required withstand voltage. When the required withstand voltage is 950 V or less, the interval between the lines may be 4.8 μm.

The interval between the divided lines in the longitudinal direction has been described hereinabove, but the same applies to the interval in the y direction between the lines that are arranged every other line but adjacent to each other in the missing portion 14a. In other words, assumed that a circle indicated with a broken line in FIG. 12 has a center at the center of the missing portion 14a, and has a diameter φ of 2.6 μm. In this case, the layout may be set in such a manner that the lines that are arranged every other line but adjacent to each other across the missing portion 14a are both present inside the circle or in contact with the circle.

Modifications of Third Embodiment

Figure 14A:
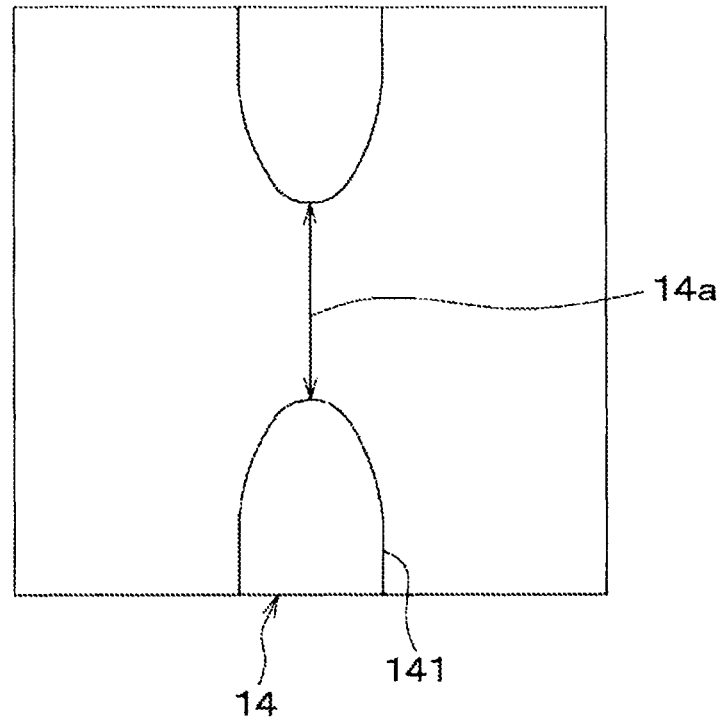
FIG. 14A is a diagram illustrating a top layout of lines of a first deep layer for showing an end shape at each divided position thereof according to a modification of the third embodiment.
Figure 14B:
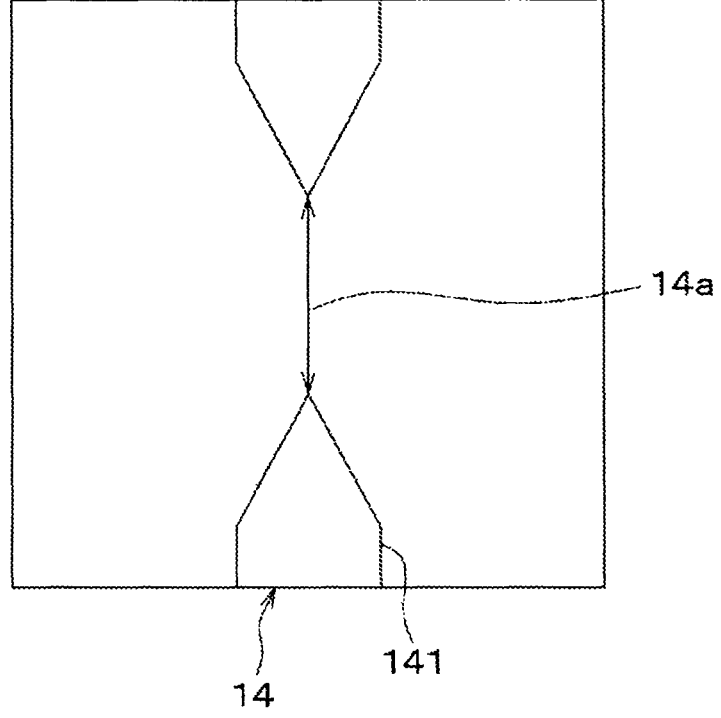
FIG. 14B is a diagram illustrating a top layout of lines of a first deep layer for showing an end shape at each divided position thereof according to a modification of the third embodiment.

In the third embodiment described above, the corner portion of the divided portion of each of the lines constituting the stripe portion 141 has an angle of 90°, so that each of the divided portions has a rectangular strip shape. On the other hand, each divided portion of each line may have a shape in which the width gradually decreases toward the end, for example, an elliptical shape including a semicircular shape as shown in FIG. 14A or a triangular shape as shown in FIG. 14B. Further, both sides in the width direction of the end of each divided portion of each line may not have the same shape.

Figure 15A:
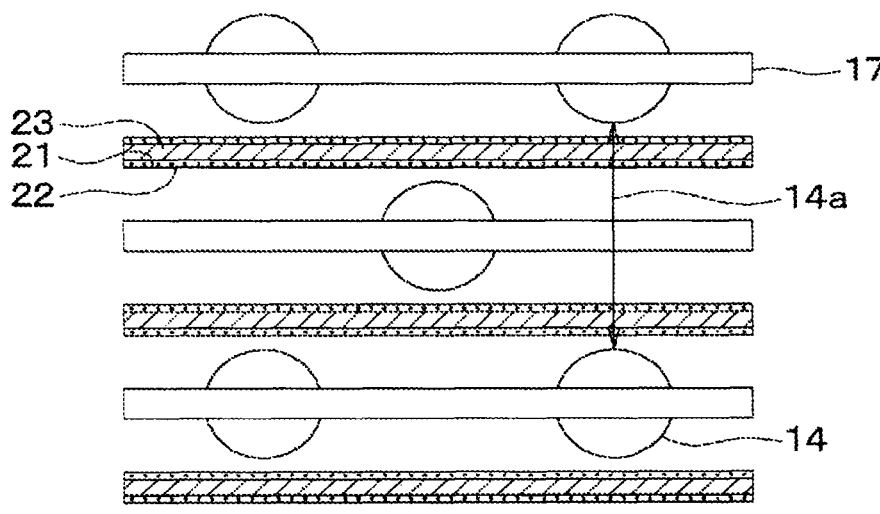
FIG. 15A is a diagram illustrating a top layout of circular-shaped dots of a stripe portion of a first deep layer according to a modification of the third embodiment.
Figure 15B:
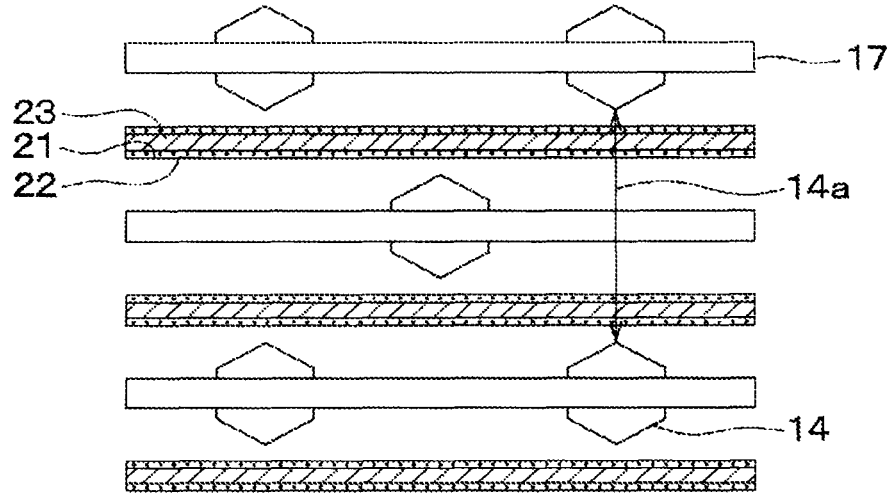
FIG. 15B is a diagram illustrating a top layout of hexagonal-shaped dots of a stripe portion of a first deep layer according to a modification of the third embodiment.

Further, in place of forming the divided portion of each line into a strip shape as in the third embodiment, each divided portion may be formed into a dot shape. Specifically, each dot may have an elliptical shape including a circular shape. For example, when each dot has a circular shape as shown in FIG. 15A, each line of the stripe portion 141 can be arranged in a polka dot shape. As another example, each dot may have a polygonal shape. For example, when each dot has a hexagonal shape as shown in FIG. 15B, each line of the stripe portion 141 can be arranged in a honeycomb shape. As described above, even when each divided portion of each line constituting the stripe portion 141 is formed into a dot shape, it is possible to suppress the increase in the on-resistance while securing the withstand voltage.

Fourth Embodiment

A fourth embodiment will be described hereinafter. In the present embodiment, the configuration of the deep layer is changed from those of the first to third embodiments, and the other configurations are similar to those of the first to third embodiments. Therefore, only a configuration different from the first to third embodiments will be described.

In the first to third embodiments described above, the deep layer has a two-layer structure in which the first deep layer 14 and the second deep layer 17 are stacked. However, it was confirmed that the forward voltage Vf fluctuates due to the influence of holes generated when the parasitically formed PN diode is energized. In addition, it was confirmed that, in the case of the deep layer having the two-layer structure including the first deep layer 14 and the second deep layer 17, basal plane dislocations (hereinafter referred to as BPD) present in SiC expand into stacking faults, which becomes a factor of inhibiting a current path and increases the on-resistance. In the present embodiment, a countermeasure is taken against the fluctuation of the forward voltage Vf and the increase of the on-resistance.

Figure 16:
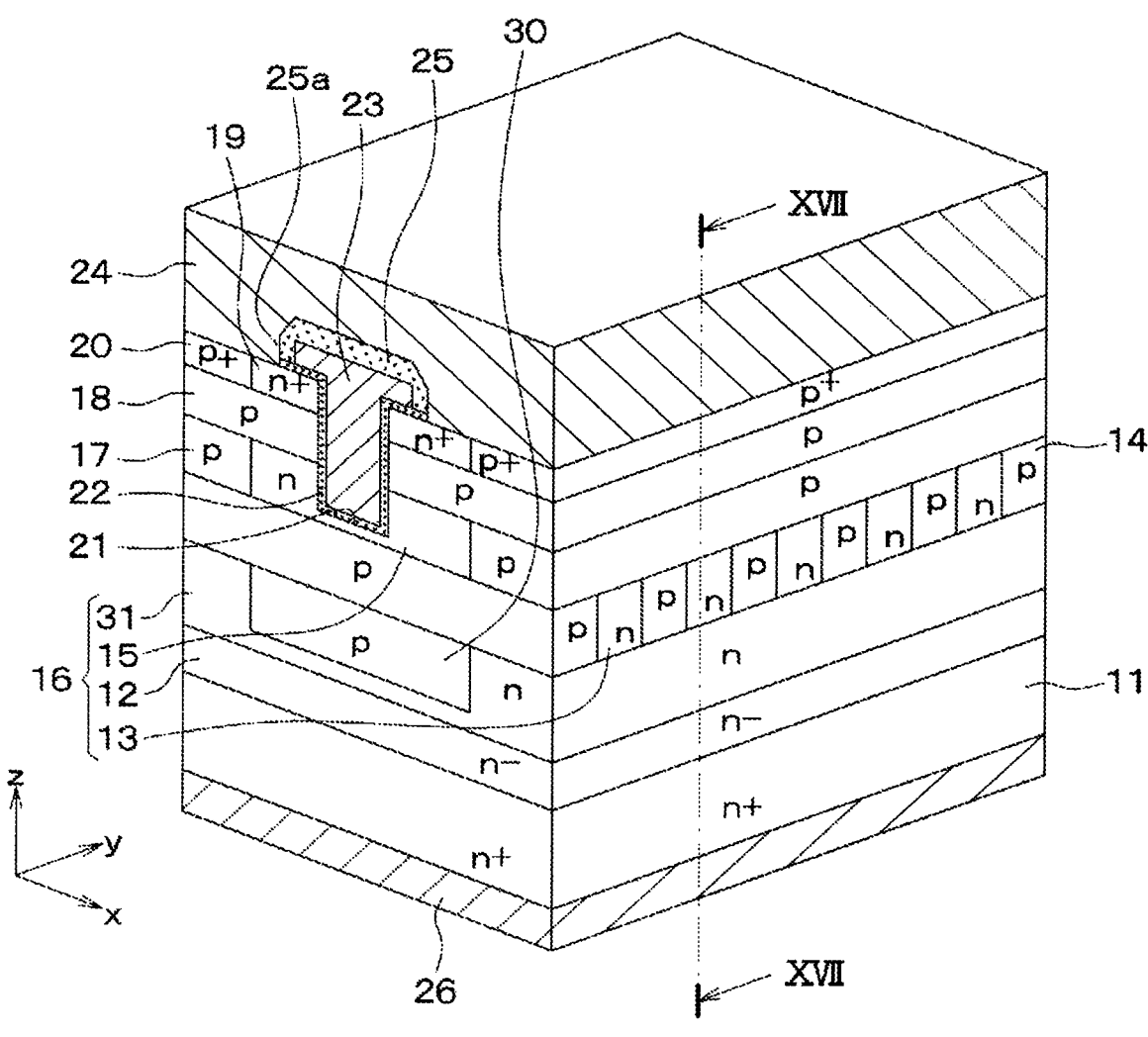
FIG. 16 is a diagram illustrating a perspective and cross-sectional view of a SiC semiconductor device according to a fourth embodiment.

As shown in FIG. 16, the SiC semiconductor device of the present embodiment includes a third deep layer 30. That is, the deep layer has a three-layer structure including the third deep layer 30 in addition to the first deep layer 14 and the second deep layer 17.

In the case of the present embodiment, the third deep layer 30 is disposed below the first current distribution layer 13 and the first deep layer 14. Specifically, the third deep layer 30 is disposed below the first deep layer 14 and at a position corresponding to the second current distribution layer 15, that is, immediately below the trench gate structure. The third deep layer 30 may be formed in the n⁻-type layer 12. In this example, however, a third current distribution layer 31 having an n-type impurity concentration higher than that of the n⁻-type layer 12 is provided adjacent to the third deep layer 30. Each of the third deep layer 30 and the third current distribution layer 31 has a stripe portion in which a plurality of lines is arranged in a stripe shape, and the lines of the respective stripe portions are alternately arranged.

At least in the active region 1a, the third deep layer 30 is provided as the stripe portion in which the plurality of lines is arranged with the same longitudinal direction as the longitudinal direction of the trench 21. The stripe portion of the third deep layer 30 corresponds to the third stripe portion. Although not shown, in the inactive region 1b, the third deep layer 30 has the stripe portion only in an area adjacent to the active region 1a. In a region outside the area adjacent to the active region 1a, the third deep layer 30 is entirely formed up to the outer peripheral region 2 to form a frame-shaped portion surrounding the stripe portion. Alternatively, the third deep layer 30 may only have the stripe portion.

The SiC semiconductor device of the present embodiment includes a metal oxide field effect transistor (MOSFET). In the MOSFET, a PN diode is formed parasitically in terms of structure. Specifically, a parasitic PN diode is provided by a PN junction between a p-type layer such as the base region 18 and an n-type layer constituting a drift layer such as the second current distribution layer 15. Therefore, when the MOSFET is applied to an inverter or the like, the parasitic PN diode is used as a freewheeling diode, so that it is not necessary to separately provide a freewheeling diode. As a result, it is possible to expect a reduction in the number of components. Hereinafter, this parasitic PN diode is referred to as a parasitic FWD.

When the parasitic FWD is operated as the diode, holes serving as minority carriers diffused from the base region 18 side into the drift layer and electrons in the drift layer are recombined. Due to the influence of the holes generated when the parasitic FWD is energized, the forward voltage Vf fluctuates and affects the element operation. In addition, the BPD in the drift layer formed of the epitaxial film expands due to the energy when holes and electrons recombine to form stacking faults. Since the BPD is a linear defect, the area occupied by the BPD in the cell region of the semiconductor device is small, and there is almost no influence on the element operation. However, in the case where the BPD is a stacking fault, the area occupied by the BPD in the cell region becomes large, and the influence on the element operation becomes large. In particular, when a large current flows to the parasitic FWD, the holes reach the substrate 11 or the like located below the drift layer. Since the BPD defect density is significantly higher in the substrate 11 than in the drift layer, the area occupied by stacking faults is further increased, and the on-resistance is increased.

Figure 17:
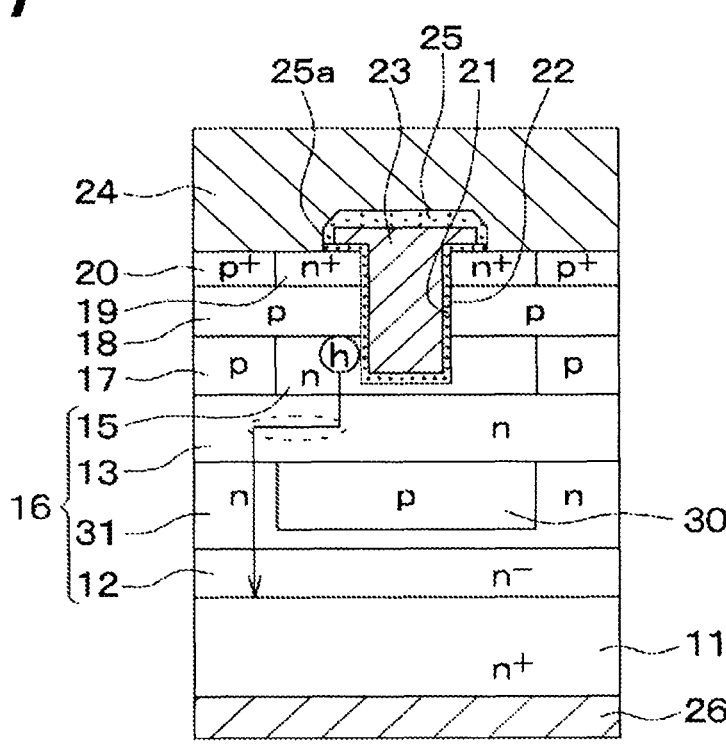
FIG. 17 is a diagram illustrating a movement path of holes in a cross-section taken along a line XVII-XVII in FIG. 16.

On the other hand, in the SiC semiconductor device of the present embodiment, the deep layer has the three-layer structure including the third deep layer 30 in addition to the first deep layer 14 and the second deep layer 17. When the deep layer has the three-layer structure, holes generated in the base region 18 pass through a movement path from the second current distribution layer 15 to the third current distribution layer 31 via the first current distribution layer 13 as indicated by an arrow in FIG. 17. Therefore, in the case of the three-layer structure, the movement path of the holes is elongated by the distance indicated by the broken line in FIG. 17, and more holes can be recombined and disappear, as compared with the case of the two-layer structure of the deep layer. As such, the holes disappear before reaching the substrate 11, and it is thus possible to suppress the fluctuation of the forward voltage Vf due to the influence of the holes. In addition, it is possible to restrict the BPD from expanding into a stacking fault. In particular, since the third current distribution layer 31 having an n-type impurity concentration higher than that of the n⁻-type layer 12 is provided adjacent to the third deep layer 30, the holes can be more easily recombined and disappear, and the formation of stacking faults is further suppressed.

As described above, in the SiC semiconductor device of the present embodiment, the deep layer has the three-layer structure including the third deep layer 30 in addition to the first deep layer 14 and the second deep layer 17. Accordingly, it is possible to suppress the influence of the element operation due to the fluctuation of the forward voltage Vf, and it is possible to suppress the expansion of the BPD to the stacking fault. Further, it is possible to suppress the increase of the on-resistance.

Modifications of Fourth Embodiment

In the fourth embodiment described above, an example in which the deep layer has the three-layer structure is described. As a modification, the deep layer may have another three-layer structure. For example, the deep layer may have a structure shown in FIG. 18. In the structure shown in FIG. 18, the pitch that is a formation interval of lines of the stripe portion of each of the third deep layer 30 and the third current distribution layer 31 is narrowed, as compared with the structure shown in FIG. 16. Specifically, the pitch of the lines of the stripe portion of the third deep layer 30 or the third current distribution layer 31 is narrower than the pitch of the lines of the stripe portion 171 of the second deep layer 17 or the stripe-shaped second current distribution layer 15.

Figure 19:
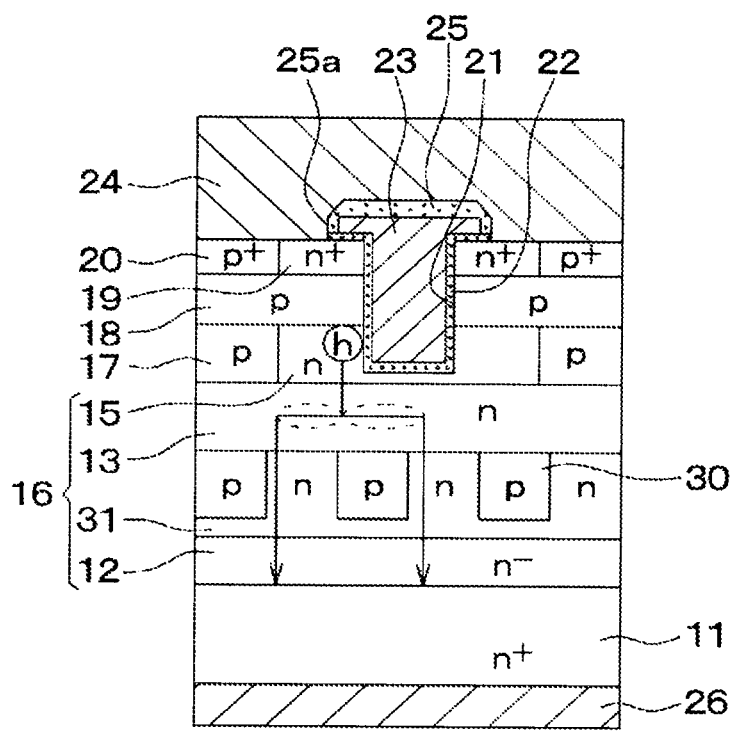
FIG. 19 is a diagram illustrating a movement path of holes in a cross-section taken along a line XIX-XIX in FIG. 18.

Even in such a structure, as shown in FIG. 19, the holes generated in the base region 18 pass through the movement path from the second current distribution layer 15 to the third current distribution layer 31 via the first current distribution layer 13. For this reason, the movement path of the holes is elongated, and more holes can be recombined and disappear. As such, the similar effects to those of the fourth embodiment can be obtained.

Figures 20, 21:
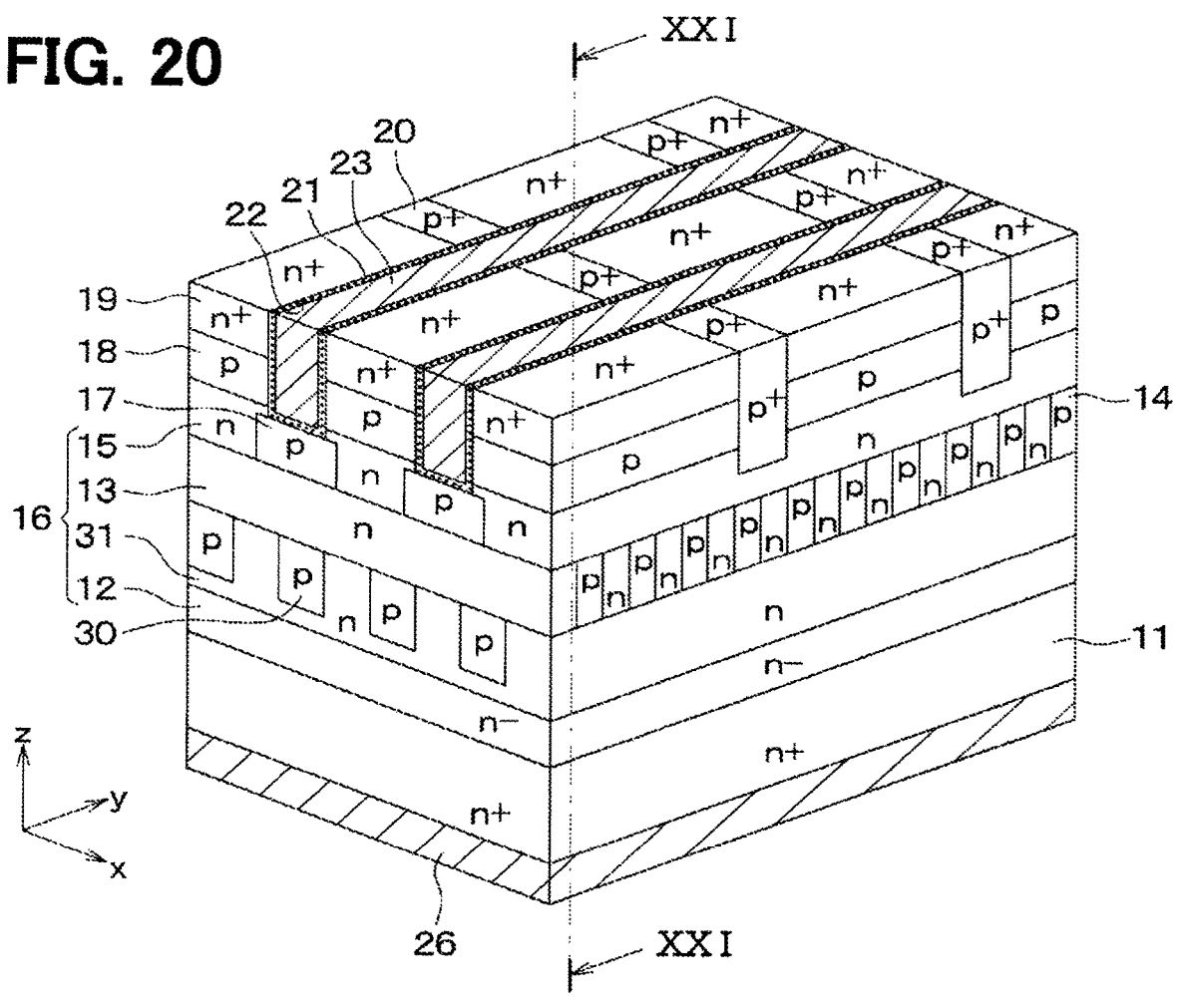
FIG. 20 is a diagram illustrating a perspective and cross-sectional view of a SiC semiconductor device according to a modification of the fourth embodiment.
FIG. 21 is a diagram illustrating a movement path of holes in a cross-section taken along a line XXI-XXI in FIG. 20.

As another modification, the deep layer may have a structure shown in FIG. 20. In the structure shown in FIG. 20, the second deep layer 17 is disposed not at a position separated from the trench gate structure as in the structure shown in FIG. 16, but at a position directly under the trench gate structure. The second deep layer 17 is disposed in contact with the bottom of the trench 21, and the second current distribution layer 15 is disposed on both sides of the trench gate structure. The second current distribution layer 15 is in contact with the side surface of the trench 21 at a position lower than the base region 18 in the side surface of the trench gate structure, that is, the second current distribution layer 15 is interposed between the base region 18 and the second deep layer 17.

When the second deep layer 17 is disposed directly under the trench gate structure, a structure for connecting the second deep layer 17 to the base region 18 is required. Therefore, the contact layer 20 is formed to intersect with the trench gate structure and has a depth that reaches the second deep layer 17. For example, a trench having a depth that penetrates the source region 19 and the base region 18 and reaches the second deep layer 17 is formed. Then, a $p^+$-type layer is formed so as to be embedded in the trench, and the contact layer 20 having the structure shown in FIG. 20 is formed by etching back the $p^+$-type layer or high acceleration ion implantation using a mask (not shown).

Also in such a structure, as shown in FIG. 21, the holes generated in the base region 18 pass through the movement path from the second current distribution layer 15 to the first current distribution layer 13 while bypassing the second deep layer 17 and further to the third current distribution layer 31. For this reason, the movement path of the holes is elongated, and more holes can be recombined and disappear. As such, the similar effects to those of the fourth embodiment can be achieved.

Figure 22:
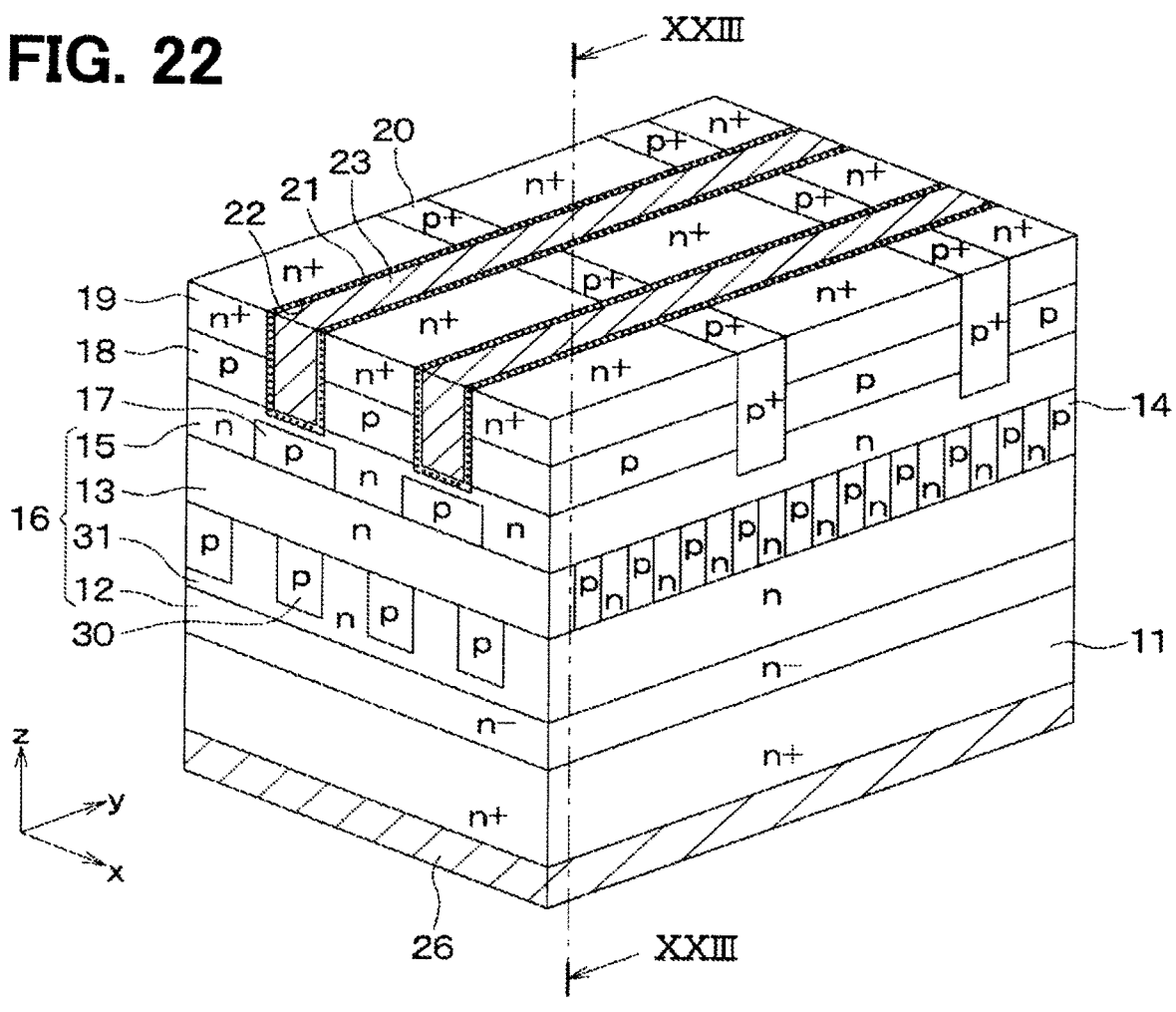
FIG. 22 is a diagram illustrating a perspective and cross-sectional view of a SiC semiconductor device according to a modification of the fourth embodiment.
Figure 23:
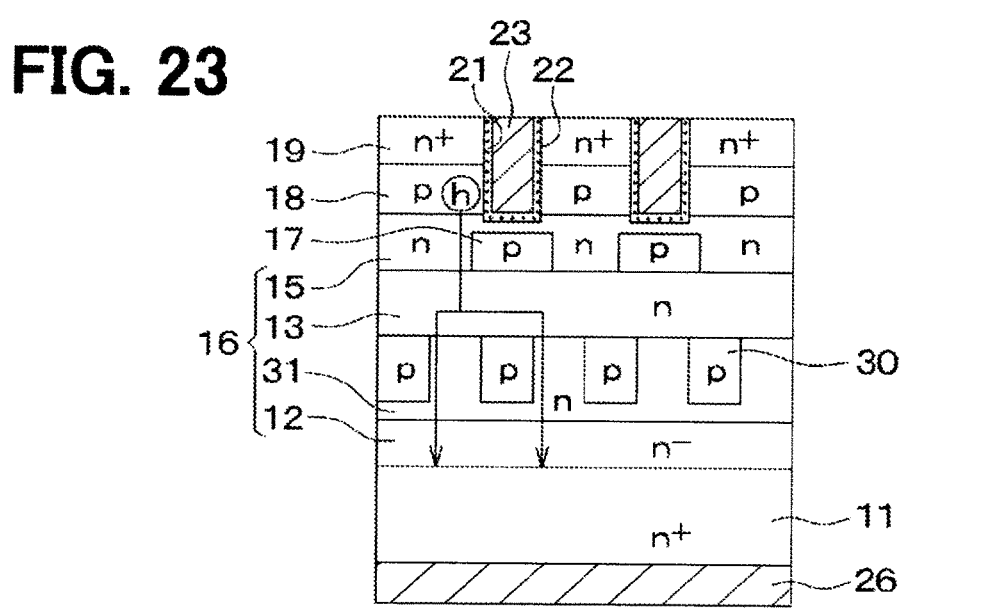
FIG. 23 is a diagram illustrating a movement path of holes in a cross-section taken along a line XXIII-XXIII in FIG. 22.

In a case where the second deep layer 17 is disposed immediately below the trench gate structure, as shown in FIG. 22, the second deep layer 17 may be separated from the bottom of the trench 21. Also in such a structure, as shown in FIG. 23, the holes generated in the base region 18 pass through the movement path from the second current distribution layer 15 to the first current distribution layer 13 while bypassing the second deep layer 17 and further to the third current distribution layer 31. For this reason, the movement path of the holes is lengthened, and more holes can be recombined and disappear. As such, the similar effects to those of the fourth embodiment can be obtained.

Figure 18:
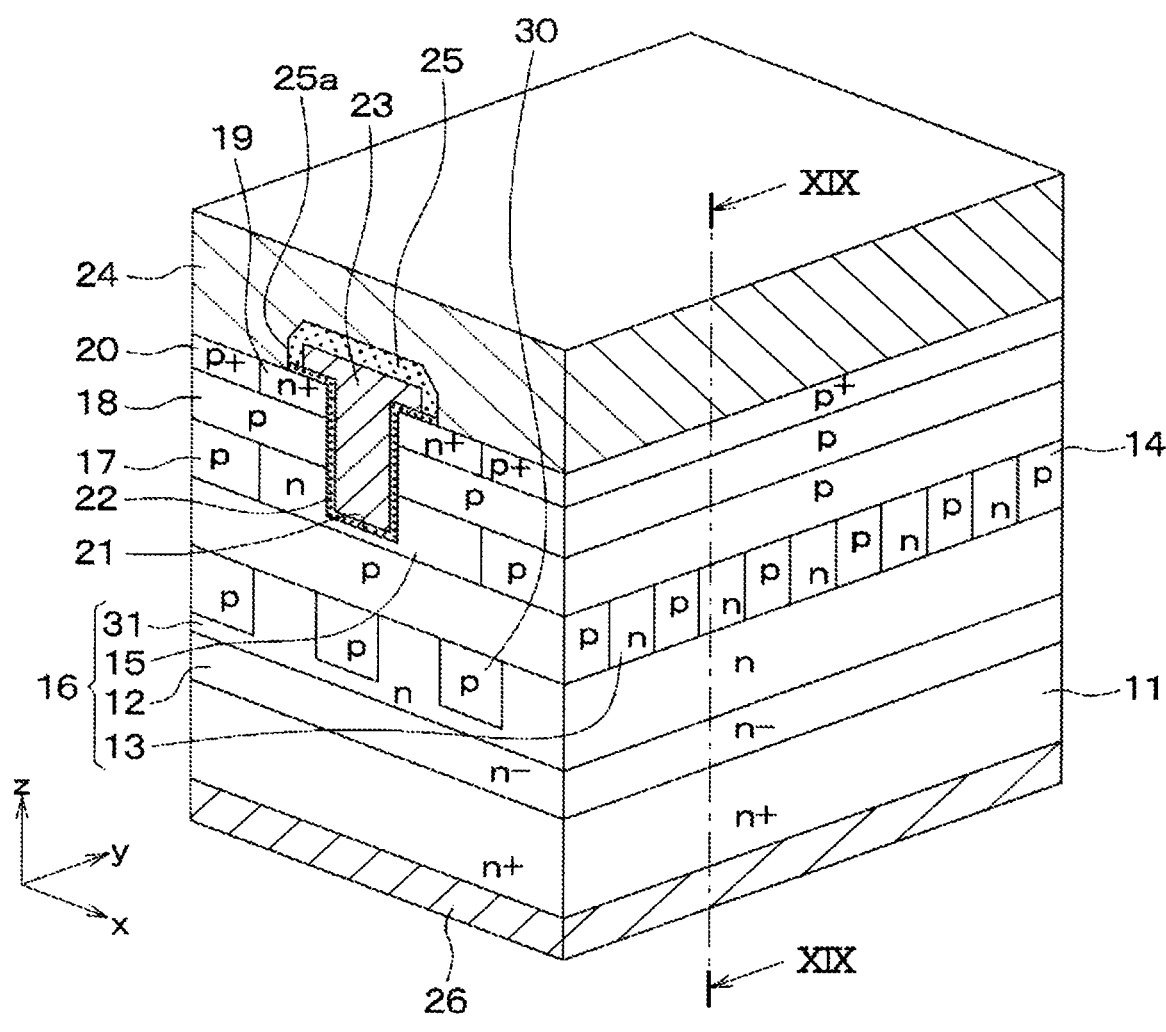
FIG. 18 is a diagram illustrating a perspective and cross-sectional view of a SiC semiconductor device according to a modification of the fourth embodiment.

In the structures shown in FIGS. 20 and 22, the pitch of the lines of the stripe portion of each of the third deep layer 30 and the third current distribution layer 31 is narrowed, as in the structure shown in FIG. 18. On the other hand, as in the fourth embodiment, the pitch of the lines of the stripe portion 171 of the second deep layer 17 or the stripe-shaped second current distribution layer 15 may be the same as the pitch of the lines of the stripe portion of the third deep layer 30 or the third current distribution layer 31.

Other Embodiments

While the present disclosure has been described in accordance with the embodiments described above, the present disclosure is not limited to the embodiments and includes various modifications and equivalent modifications. In addition, various combinations and configurations, as well as other combinations and configurations that include only one element, more, or less, fall within the scope and spirit of the present disclosure.

In each of the embodiments described above, the n-channel type MOSFET in which the first conductivity type is the n-type, and the second conductivity type is the p-type has been described as an example, but the conductivity type of each component may be inverted. That is, the present disclosure can also be applied to p-channel type MOSFETs. In each of the embodiments described above, the MOSFET having the trench gate structure has been described as an example of the semiconductor switching element. However, the present disclosure can also be applied to an insulated gate bipolar transistor (IGBT) having a similar trench gate structure. In the IGBT, only the conductivity type of the substrate 1 is changed from the n-type to the p-type with respect to each of the embodiments described above, and other structures and manufacturing methods are the same as those of the embodiments described above.

In each of the embodiments described above, the stripe portion 141 of the first deep layer 14 may extend along the y-axis direction, for example. In other words, the first deep layer 14 may extend in the same direction as that of the second deep layer 17. In each of the embodiments described above, the second current distribution layer 15 may have, for example, the same impurity concentration as that of the $n^-$-type layer 12. The first current distribution layer 13 may be formed not only in the cell region 1 but also in the outer peripheral region 2.

In each of the embodiments described above, the second deep layer 17 includes the frame-shaped portion 172 in the inactive region 1b. However, as long as the first deep layer 14 includes the frame-shaped portion 142, the second deep layer 17 may include only the stripe portion 171.

In each of the embodiments described above, the SiC semiconductor device using SiC as a semiconductor material has been described as an example, but the similar effects can be achieved by applying the similar configurations to those of each embodiment described above to a semiconductor device using another semiconductor material, such as Si.

In each of the embodiments described above, the case where the substrate 11 constitutes the semiconductor region has been described. However, the semiconductor region may not necessarily be constituted by the substrate 11. For example, when silicon is used as the semiconductor material, a portion corresponding to the first impurity region may be formed by a silicon substrate, and a high concentration region having a higher impurity concentration than the silicon substrate may be formed on the back surface side of the silicon substrate by ion implantation or the like. In such a case, the high concentration region formed on the back surface side of the silicon substrate constitutes the semiconductor region.

In the case of indicating the crystal orientation, a bar (-) should be added over a desired number properly. Since there is restriction on expression based on electronic filing, in the present specification, a bar is attached before a desired number.

What is claimed is:

1. A semiconductor device having an active region formed with a semiconductor switching element having a plurality of trench gate structures and being operated as an element, and an inactive region surrounding the active region and being not operated as the element, the semiconductor device comprising:

the switching element that includes:

a semiconductor region of a first or second conductivity type;

a first impurity region of the first conductivity type, the first impurity region disposed above the semiconductor region and having an impurity concentration lower than that of the semiconductor region;

a base region of the second conductivity type, the base region disposed above the first impurity region;

a second impurity region of the first conductivity type, the second impurity region disposed above the base region and having an impurity concentration higher than that of the first impurity region;

the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region;

a first electrode electrically connected to the second impurity region and electrically connected to the base region; and a second electrode disposed on a back side of the semiconductor region opposite to the first impurity region and electrically connected to the semiconductor region;

a first current distribution layer of the first conductivity type, the first current distribution layer disposed between the first impurity region and the base region and having an impurity concentration higher than that of the first impurity region;

a first deep layer of the second conductivity type, the first deep layer including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion;

a second deep layer of the second conductivity type, the second deep layer including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer; and a second current distribution layer of the first conductivity type disposed between the first current distribution layer and the base region, and arranged between the plurality of lines of the second stripe portion, wherein each of the plurality of lines of the first stripe portion has an end portion connecting to the frame-shaped portion and an inner portion located on an inner side of the end portion, and the end portion has a width equal to or greater than a width of the inner portion.

2. The semiconductor device according to claim 1, wherein the width of the end portion gradually increases as a function of distance from the inner portion, and an end portion of the first current distribution layer has one of a trapezoidal shape, a triangular shape, and an elliptical shape.

3. The semiconductor device according to claim 1, wherein the first direction intersects with the second direction, and each of the lines of the first stripe portion is divided into divided portions at a missing portion to have a broken line shape, and each of the plurality of trench gate structures passes through the missing portions of the respective lines of the first stripe portion.

4. The semiconductor device according to claim 1, further comprising:

a third deep layer of the second conductivity type, wherein the third deep layer includes a third stripe portion having a plurality of lines extending in the first direction and disposed below the first deep layer and the first current distribution layer.

5. A semiconductor device having an active region formed with a semiconductor switching element having a plurality of trench gate structures and being operated as an element, and an inactive region surrounding the active region and being not operated as the element, the semiconductor device comprising:

the switching element that includes:

a semiconductor region of a first or second conductivity type;

a first impurity region of the first conductivity type, the first impurity region disposed above the semiconductor region and having an impurity concentration lower than that of the semiconductor region;

a base region of the second conductivity type, the base region disposed above the first impurity region;

a second impurity region of the first conductivity type, the second impurity region disposed above the base region and having an impurity concentration higher than that of the first impurity region;

the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region;

a first electrode electrically connected to the second impurity region and electrically connected to the base region; and a second electrode disposed on a back side of the semiconductor region opposite to the first impurity region and electrically connected to the semiconductor region;

a first current distribution layer of the first conductivity type, the first current distribution layer disposed between the first impurity region and the base region and having an impurity concentration higher than that of the first impurity region;

a first deep layer of the second conductivity type, the first deep layer including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion;

a second deep layer of the second conductivity type, the second deep layer including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer; and a second current distribution layer of the first conductivity type disposed between the first current distribution layer and the base region, and arranged between the plurality of lines of the second stripe portion, wherein each of the plurality of lines of the second stripe portion has an end portion and an inner portion located on an inner side of the end portion, and the end portion of the line of the second stripe portion has a width greater than a width of the inner portion.

6. The semiconductor device according to claim 5, wherein the width of the end portion of the line of the second stripe portion gradually increases as a function of distance from the inner portion, and an end portion of the second current distribution layer has one of a rectangular shape, a triangular shape, and an elliptical shape.

7. The semiconductor device according to claim 5, wherein the first direction intersects with the second direction, and each of the lines of the first stripe portion is divided into divided portions at a missing portion to have a broken line shape, and each of the plurality of trench gate structures passes through the missing portions of the respective lines of the first stripe portion.

8. The semiconductor device according to claim 5, further comprising:

a third deep layer of the second conductivity type, wherein the third deep layer includes a third stripe portion having a plurality of lines extending in the first direction and disposed below the first deep layer and the first current distribution layer.

9. A semiconductor device having an active region formed with a semiconductor switching element having a plurality of trench gate structures and being operated as an element, and an inactive region surrounding the active region and being not operated as the element, the semiconductor device comprising:

the switching element that includes:

a semiconductor region of a first or second conductivity type;

a first impurity region of the first conductivity type, the first impurity region disposed above the semiconductor region and having an impurity concentration lower than that of the semiconductor region;

a base region of the second conductivity type, the base region disposed above the first impurity region;

a second impurity region of the first conductivity type, the second impurity region disposed above the base region and having an impurity concentration higher than that of the first impurity region;

the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region;

a first electrode electrically connected to the second impurity region and electrically connected to the base region; and a second electrode disposed on a back side of the semiconductor region opposite to the first impurity region and electrically connected to the semiconductor region;

a first current distribution layer of the first conductivity type, the first current distribution layer disposed between the first impurity region and the base region and having an impurity concentration higher than that of the first impurity region;

a first deep layer of the second conductivity type, the first deep layer including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion;

a second deep layer of the second conductivity type, the second deep layer including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer; and a second current distribution layer of the first conductivity type disposed between the first current distribution layer and the base region, and arranged between the plurality of lines of the second stripe portion, wherein the first direction intersects with the second direction, and each of the lines of the first stripe portion is divided into divided portions at a missing portion to have a broken line shape, and each of the plurality of trench gate structures passes through the missing portions of the respective lines of the first stripe portion.

10. The semiconductor device according to claim 9, wherein the missing portion of each of the lines of the first stripe portion is 2.6 μm or less, and the lines of the first stripe portion are arranged so that two of the lines that are apart from each other across another line are in contact with or present inside a circle that defines a center at a center of the missing portion of the another line and has a diameter of 2.6 μm.

11. The semiconductor device according to claim 9, wherein each of the divided portions of each line divided into the broken line shape has a strip shape, and the plurality of lines of the first stripe portion is arranged so that the missing portions are staggered in the second direction.

12. The semiconductor device according to claim 9, wherein each of the divided portions of each line of the first stripe portion has a circular dot shape, and the plurality of lines of the first stripe portion is arranged so that the missing portions are staggered in the second direction.

13. The semiconductor device according to claim 9, wherein each of the divided portions of each line of the first stripe portion has a polygonal dot shape, and the plurality of lines of the first stripe portion is arranged so that the missing portions are staggered in the second direction.

14. The semiconductor device according to claim 9, further comprising:

a third deep layer of the second conductivity type, wherein the third deep layer includes a third stripe portion having a plurality of lines extending in the first direction and disposed below the first deep layer and the first current distribution layer.

15. A semiconductor device having an active region formed with a semiconductor switching element having a plurality of trench gate structures and being operated as an element, and an inactive region surrounding the active region and being not operated as the element, the semiconductor device comprising:

the switching element that includes:

a semiconductor region of a first or second conductivity type;

a first impurity region of the first conductivity type, the first impurity region disposed above the semiconductor region and having an impurity concentration lower than that of the semiconductor region;

a base region of the second conductivity type, the base region disposed above the first impurity region;

a second impurity region of the first conductivity type, the second impurity region disposed above the base region and having an impurity concentration higher than that of the first impurity region;

the plurality of trench gate structures each including a gate insulating film disposed on an inner wall surface of a trench and a gate electrode disposed on the gate insulating film in the trench, the trench extending in a first direction as a longitudinal direction and having a depth from a surface of the second impurity region to a position deeper than the base region;

a first electrode electrically connected to the second impurity region and electrically connected to the base region; and a second electrode disposed on a back side of the semiconductor region opposite to the first impurity region and electrically connected to the semiconductor region;

a first current distribution layer of the first conductivity type, the first current distribution layer disposed between the first impurity region and the base region and having an impurity concentration higher than that of the first impurity region;

a first deep layer of the second conductivity type, the first deep layer including a first stripe portion having a plurality of lines extending in a second direction in the active region and a part of the inactive region adjacent to the active region, and a frame-shaped portion disposed in the inactive region to surround the first stripe portion and connecting to the plurality of lines of the first stripe portion;

a second deep layer of the second conductivity type, the second deep layer including a second stripe portion having a plurality of lines disposed between the first deep layer and first current distribution layer and the base region in the active region and in a part of the inactive region adjacent to the active region, the plurality of lines of the second stripe portion extending in the first direction and connecting to the base region and the first deep layer;

a second current distribution layer of the first conductivity type disposed between the first current distribution layer and the base region, and arranged between the plurality of lines of the second stripe portion; and a third deep layer of the second conductivity type, the third deep layer including a third stripe portion having a plurality of lines extending in the first direction and disposed below the first deep layer and the first current distribution layer.

16. The semiconductor device according to claim 15, wherein each of the lines of the third stripe portion is located at a position corresponding to the second current distribution layer.

17. The semiconductor device according to claim 15, wherein an interval between the lines of the third stripe portion is smaller than an interval between the lines of the second stripe portion.

18. The semiconductor device according to claim 15, further comprising:

a third current distribution layer of the second conductivity type, wherein the third current distribution layer is disposed between the lines of the third stripe portion and has an impurity concentration higher than that of the first impurity region.

19. The semiconductor device according to claim 15, wherein each of the lines of the second stripe portion is disposed immediately below the trench.

20. The semiconductor device according to claim 15, wherein each of the lines of the second stripe portion is disposed immediately below and in contact with the trench.

21. The semiconductor device according to claim 15, wherein each of the lines of the second stripe portion is disposed immediately below the corresponding trench but spaced from the trench.

* * * * *